(12) United States Patent
Takazawa et al.

(10) Patent No.: US 7,046,573 B2
(45) Date of Patent: May 16, 2006

(54) SEMICONDUCTOR INTEGRATED CIRCUIT AND IC CARD

(75) Inventors: Yoshio Takazawa, Kodaira (JP); Toshio Yamada, Koganei (JP); Shinichi Ozawa, Hachioji (JP); Takeo Kanai, Kodaira (JP); Minoru Katoh, Akiruno (JP); Koudou Yamauchi, Fukuoka (JP); Toshihiro Araki, Dazaifu (JP)

(73) Assignees: Renesas Technology Corp., Tokyo (JP); Hitachi ULSI Systems, Co.,, Ltd., Tokyo (JP)

( * ) Notice: Subject to any disclaimer, the term of this patent is extended or adjusted under 35 U.S.C. 154(b) by 118 days.

(21) Appl. No.: 10/748,137

(22) Filed: Dec. 31, 2003

(65) Prior Publication Data

US 2004/0151033 A1     Aug. 5, 2004

(30) Foreign Application Priority Data

Jan. 24, 2003   (JP)   ............................. 2003-016573
Oct. 30, 2003   (JP)   ............................. 2003-370078

(51) Int. Cl.
*G11C 7/00*   (2006.01)
(52) U.S. Cl. ....................................... 365/229; 365/233
(58) Field of Classification Search ................ 365/229, 365/233
See application file for complete search history.

(56) References Cited

U.S. PATENT DOCUMENTS

| | | | | |
|---|---|---|---|---|
| 5,357,193 A | * | 10/1994 | Tanaka et al. | ............... 365/201 |
| 6,442,080 B1 | * | 8/2002 | Tanzawa et al. | ....... 365/189.09 |
| 6,535,415 B1 | * | 3/2003 | Takemura et al. | ............ 365/63 |

FOREIGN PATENT DOCUMENTS

| | | |
|---|---|---|
| JP | 04-074395 | 7/1990 |
| JP | 08-083487 | 9/1994 |

* cited by examiner

*Primary Examiner*—Thong Q. Le
(74) *Attorney, Agent, or Firm*—Reed Smith LLP; Stanley P. Fisher, Esq.; Juan Carlos A. Marquez, Esq.

(57) ABSTRACT

A semiconductor integrated circuit has a memory which can enter active state or standby state, and the memory has voltage generation circuits for bit lines and source lines with which memory cells are connected. The voltage generation circuits make the potential of the bit lines and the potential of the source lines equal to each other in response to an instruction to transition from active state to standby state. The voltage generation circuits produce a potential difference between the bit lines and the source lines in response to an instruction to transition from standby state to active state. In standby state, the potential of the bit lines and that of the source lines are equal to each other. Therefore, sub-threshold leakage does not occur between the source and drain of each memory cell. In active state, the source line potential is not varied.

17 Claims, 21 Drawing Sheets

(NOR)

(NAND)

(AND)

SEMICONDUCTOR INTEGRATED CIRCUIT AND IC CARD

BACKGROUND OF THE INVENTION

The present invention relates to a semiconductor integrated circuit provided with a memory and more particularly to a technology for reducing leakage currents in memory cells in low-power consumption state, such as standby state, which is applicable to, for example, a microcomputer provided with a large-capacity ROM.

There is a technology for reducing power consumption and yet preventing increase in access delay. According to this technology, the substrate bias voltage of a peripheral circuit when DRAM is active is made different from that when the DRAM is on standby. Thereby, sub-threshold leakage in the memory peripheral circuit on standby is suppressed and the above object is attained. (Refer to Patent Document 1.)

According to another technology, the bit lines and the source lines of memory cells unselected for access when a memory is active are brought to a bit line potential. Thereby, sub-threshold leakage in the memory cells unselected for access is suppressed. (Refer to Patent Document 2.)

[Patent Document 1]

Japanese Patent Prepublication No. Hei 8(1996)-83487

[Patent Document 2]

Japanese Patent Prepublication No. Hei 4(1992)-74395

SUMMARY OF THE INVENTION

The inventors considered leakage currents which are produced in a memory array in standby state. For example, a mask ROM stores information based on the presence or absence of contact between memory cells and bit lines, the presence or absence of the diffusion layer of memory cell transistors, or the like. In operation of reading out stored information, it is judged whether electric charges in precharged bit lines are pulled out to source lines through memory cells. With microminiaturization of circuit elements and reduction in the voltage of operating power supplies, a sub-threshold leakage current is produced between source and drain even in a MOS transistor whose gate is unselected. Therefore, wasteful power consumption due to sub-threshold leakage occurs even in standby state as long as a potential difference is produced between the source and drain of a memory cell by bit line precharge. Some microcomputers are kept in standby state or in process wait state for the most part of time depending on the applications thereof. Such applications include controlling of equipment which has charge of processing transmit/receive data and transfer data. In consideration of these applications, the inventors recognized the importance of suppressing sub-threshold leakage currents in on-chip large-capacity memories even in standby state.

Patent Document 1 is based on the standpoint that sub-threshold leakage is suppressed in stand by state. However, the document relates to a peripheral circuit, not to a memory cell array which accounts for a major portion of a chip area. It is different from the present invention in the object of reduction in power consumption. In addition, the technology disclosed in Patent Document 1 is threshold voltage control. It requires a relatively large number of incidental circuits, including reference voltage generation circuit, substrate bias generation circuit, transistors which selectively connect power supply terminals and substrate bias terminals, and the like.

The technology disclosed in Patent Document 2 is that the bit lines and source lines of memory cells unselected for access when a memory is active are brought to a bit line potential. With this technology, wasteful power consumption in active state can be reduced; however, there is the possibility that the access rate may be lowered. More specifically, source lines which transition from a state of unselected for access to a state of selected for access must be discharged before readout operation is started. The cycle of readout operation is lengthened by a time for which it waits for the completion of the discharge operation.

An object of the present invention is to provide a semiconductor integrated circuit wherein power wastefully consumed in a memory in standby state can be reduced without complication of the circuit.

Another object of the present invention is to provide a semiconductor integrated circuit wherein power wastefully consumed in a memory on standby can be reduced without lowering the speed of operation of reading data out of the memory.

The above and other objects and novel features of the present invention will be apparent from the description in this specification and accompanying drawings.

The outline of typical ones of inventions disclosed in this specification will be briefly described as follows:

(1) A semiconductor integrated circuit according to a first aspect of the present invention comprises a memory which can enter active state or standby state. The memory has voltage generation circuits (19, 20, 21, 22) for bit lines and source lines with which memory cells are connected. In response to an instruction to transition from active state to standby state, the voltage generation circuit makes the potential of the bit lines and that of the source lines equal to each other. In response to an instruction to transition from standby state to active state, the voltage generation circuit produces a potential difference between the bit lines and the source lines.

According to the above aspect of the present invention, the potential of the bit lines and that of the source lines are made equal to each other in standby state. Therefore, sub-threshold leakage does not occur at all between the sources and drains of memory cells. In active state, a potential difference is produced between the bit lines and the source lines. Thus, a control technique wherein a potential difference is produced between the bit lines and the source lines depending on whether memory cells are selected or unselected is not adopted. Therefore, the speed of operation of reading data out of the memory is not lowered.

As a concrete embodiment of the present invention according to the first aspect, the voltage generation circuit makes the potential of the source lines equal to the precharge potential of the bit lines in response to an instruction to transition from active state to standby state. The source lines only have to be at the discharge level in active state and the potential thereof need not be varied at some point or another. Therefore, provision of a circuit for making the potential of the source lines equal to the precharge potential of the bit lines in standby state hardly has influences on the operation in active state. The circuitry can be simplified. In other words, application of the present invention to a conventional circuit does not require addition of a new circuit to the periphery of the bit lines. Therefore, load fluctuation does not occur around the bit lines, which saves time and labor for redesigning.

As another concrete embodiment of the present invention according to the first aspect, the voltage generation circuit makes the potential of the bit lines equal to the discharge potential of the source lines in response to an instruction to transition from active state to standby state. When the potential of the source lines and that of the bit lines are made equal to the discharge potential of the source lines in standby state, the following occurs: word lines connected with the select terminals of memory cells are also brought to an unselect level, such as source line discharge potential. Therefore, a leakage current is not produced between gate and drain or between gate and source, either. However, since circuitry wherein the bit lines are discharged in standby state is added to the periphery of the bit lines, some measures will be probably required for applying this to a conventional circuit. Such measures include a contrivance for suppressing load fluctuation around bit lines and reconsideration of operation timing margin. This constitution will probably increase time and labor for redesigning as compared with a constitution wherein the source lines are charged to the bit line precharge level on standby.

If a voltage generation circuit which makes the potential of the source lines equal to the precharge potential of the bit lines in standby state, as mentioned above, is adopted, the voltage generation circuit is preferably constituted as follows: the voltage generation circuit discharges the source lines in response to an instruction to transition from standby state to active state. Further, the current supplying capability thereof is varied so that the discharge rate will be enhanced stepwise. Fundamentally, the source lines only have to have capability to pull in currents passed through memory cells selected in active state. The foregoing is for preventing currents from concentratedly flowing from a large number of memory cells to such source lines at a time. Thus, the production of relatively large noise is prevented.

(2) A semiconductor integrated circuit according to a second aspect of the present invention comprises a central processing unit and a memory accessible from the central processing unit. The semiconductor integrated circuit can enter active state or stand by state. The memory comprises memory cells connected with bit lines and source lines. The memory is so constituted that the potential of the bit lines and that of the source lines will be made equal to each other in standby state. Further, the memory is so constituted that a potential difference can be produced between the bit lines and the source lines in active state.

According to the above aspect of the present invention, the potential of the bit lines and that of the source lines are equal to each other in standby state. Therefore, sub-threshold leakage does not occur between the source and drain of a memory cell. In active state, a potential difference is produced between the bit lines and the source lines. Thus, a technique wherein a potential difference is produced between the bit lines and the source lines depending on whether memory cells are selected or unselected is not adopted. Therefore, the speed of operation of reading data out of the memory is not lowered.

As a concrete embodiment of the present invention according to the second aspect, the central processing unit stops instruction execution in standby state. Thus, the memory stops access operation.

As another concrete embodiment of the present invention according to the second aspect, the instructions to transition from active state to standby state and the instructions to transition from standby state to active state are given by an external control signal. The instructions to transition from active state to standby state may be given by the central processing unit executing a predetermined instruction. The instructions to transition from standby state to active state may be given by an interrupt.

(3) A semiconductor integrated circuit according to a third aspect of the present invention comprises a memory which can enter active state or standby state and a central processing unit which can access the memory. The memory comprises memory cells connected with bit lines and source lines. The memory makes the potential of the source lines equal to the precharge potential of the bit lines in standby state, and brings the source lines to discharge potential in active state. In standby state, the potential of the bit lines and that of the source lines are made equal to the bit line precharge potential. Therefore, sub-threshold leakage does not occur at all between the source and drain of a memory cell. In active state, a potential difference is produced between the bit lines and the source lines. Thus, a control technique wherein a potential difference is produced between the bit lines and the source lines depending on whether memory cells are selected or unselected is not adopted. Therefore, the speed of operation of reading data out of the memory is not lowered. The source lines only have to be at the discharge level in active state and the potential thereof need not be varied at some point or another. Therefore, provision of a circuit for making the potential of the source lines equal to the precharge potential of the bit lines in standby state hardly has influences on the operation in active state. The circuitry can be simplified.

A semiconductor integrated circuit according to a fourth aspect of the present invention comprises a memory which can enter active state or standby state and a central processing unit which can access the memory. The memory comprises memory cells connected with bit lines and source lines. The memory makes the potential of the bit lines equal to the discharge potential of the source lines in standby state, and brings the bit lines to precharge potential in active state. In standby state, the potential of the bit lines and that of the source lines are made equal to the source line discharge potential. Therefore, sub-threshold leakage does not occur at all between the source and drain of a memory cell. In active state, a potential difference is produced between the bit lines and the source lines. Thus, a control technique wherein a potential difference is produced between the bit lines and the source lines depending on whether memory cells are selected or unselected is not adopted. Therefore, the speed of operation of reading data out of the memory is not lowered. When the potential of the source lines and that of the bit lines are made equal to the discharge potential of the source line in standby state, the following occurs: word lines connected with the select terminals of memory cells are also brought to an unselect level, such as source line discharge potential. Therefore, a leakage current is not produced between gate and drain or between gate and source, either.

As a concrete embodiment of the present invention according to the third and fourth aspects, the central processing unit is brought into a state in which instruction execution is stopped in parallel with entrance of the memory into standby state. The standby state and the state in which instruction execution is stopped can be released by an interrupt or an external control signal.

(4) A semiconductor integrated circuit according to a fifth aspect of the present invention comprises a central processing unit and a memory accessible from the central processing unit. The memory comprises bit lines connected with a first circuit; source lines connected with a second circuit; and memory cells which are connected with the bit lines and the source lines and whose select terminals are connected with word lines. With respect to the semiconductor integrated circuit, two states are selectable: first state and second state. In the first state, the access operation of the memory and the data processing operation of the central processing unit are enabled. In the second state, the access operation of the memory and the data processing operation of the central processing unit are disabled. In the first state, the first circuit charges the bit lines, and the second circuit discharges the source lines. In the second state, the first circuit charges the bit lines, and the second circuit charges the source lines.

A semiconductor integrated circuit according to a sixth aspect of the present invention comprises a central processing unit and a memory accessible from the central processing unit. The memory comprises bit lines connected with a first circuit; source lines connected with a second circuit; and memory cells which are connected with the bit lines and the source lines and whose select terminals are connected with word lines. With respect to the semiconductor integrated circuit, two states are selectable: first state and second state. In the first state, the access operation of the memory and the data processing operation of the central processing unit are enabled. In the second state, the access operation of the memory and the data processing operation of the central processing unit are disabled. In the first state, the first circuit charges the bit lines, and the second circuit discharges the source lines. In the second state, the first circuit discharges the bit lines, and the second circuit discharges the source lines.

For example, the first state is the active state of the semiconductor integrated circuit, and the second state is the standby state of the semiconductor integrated circuit.

As a concrete embodiment of the present invention according to the fifth and sixth aspects, the ultimate level for the discharge is the ground potential of the circuit, and the unselect level for the word lines is the ground potential of the circuit.

As a concrete embodiment of the present invention according to the fifth and sixth aspects, the first circuit stops charge operation for bit lines as the objects of readout in the first state.

(5) An IC card according to the present invention is mounted on a card substrate with a semiconductor integrated circuit and an external interface portion connected with the semiconductor integrated circuit. The semiconductor integrated circuit comprises a central processing unit and a memory accessible from the central processing unit. The memory comprises memory cells connected with bit lines and source lines. When the semiconductor integrated circuit is in low-power consumption state, the memory makes the potential of the bit lines and that of the source lines equal to each other. The memory is a mask ROM, for example.

(6) An IC card according to another aspect of the present invention has on a card substrate a semiconductor integrated circuit and external connection electrodes. The semiconductor integrated circuit is selectively brought into standby state or active state, and comprises a central processing unit and a memory. The memory comprises memory cells connected with bit lines and source lines. In active state, a predetermined potential difference is produced between the bit lines and the source lines. In standby state, the potential difference between the bit lines and the source lines is made smaller than the above potential difference in active state. The predetermined potential difference is based on, for example, the level of supply voltage to the bit lines and the level of ground voltage of the circuit to the source lines. The potential difference smaller than the above potential difference in active state is based on, for example, the level of supply voltage to the bit lines and the level of supply voltage to the source lines.

As a concrete embodiment, the central processing unit executes a sleep instruction in active state, and transitions to standby state. To further reduce power consumption in standby state, a clock pulse generator is provided which generates internal clock from external clock. The clock pulse generator outputs internal clock in active state and stops the output of internal clock in standby state. Further, a regulator is provided which generates internal supply voltage from external supply voltage. In standby, the regulator reduces the internal supply voltage state to a value lower than that in active state.

(7) An IC card according to a further aspect of the present invention has on a card substrate a semiconductor integrated circuit and external connection electrodes. The semiconductor integrated circuit is selectively brought into standby state or active state, and comprises a central processing unit and a memory. The memory comprises memory cells connected with bit lines and source lines. The semiconductor integrated circuit carries out initialization in response to a reset instruction from the outside. The integrated circuit notifies the outside of the completion of initialization to transition to active state. In active state, the semiconductor integrated circuit produces a predetermined potential difference between the bit lines and the source lines of the memory. Further, the integrated circuit causes the central processing unit to process data in response to an instruction from the outside. The integrated circuit transitions to standby state by the central processing unit executing a sleep instruction. In standby state, the semiconductor integrated circuit reduces the potential difference between the bit lines and the source lines of the memory to a value lower than the above potential difference in active state. The integrated circuit transitions to active state in response to a standby release signal. In the process of the transition, the integrated circuit produces a predetermined potential difference between the bit lines and the source lines by source line discharge. Thus, the integrated circuit enhances the discharge rate stepwise.

(8) A semiconductor integrated circuit according to a further aspect of the present invention comprises memory cells connected with bit lines and source lines; and voltage generation circuits for the bit lines and the source lines. The integrated circuit is selectively brought into standby state or active state. Inactive state, the voltage generation circuit produces a predetermined potential difference between the bit lines and the source lines. In standby state, the generation circuit reduces the potential difference between the bit lines and the source lines of the memory to a value smaller than the above potential difference inactive state. As a concrete embodiment, the voltage generation circuit performs the following in the process of transition of the semiconductor integrated circuit from standby state to active state: the generation circuit produces the above predetermined potential difference between the bit lines and the source lines by source line discharge. Thus, the generation circuit enhances the discharge rate stepwise.

The effects produced by typical ones of the inventions disclosed in this application will be briefly described as follows:

Since the potential of bit lines and that of source lines are made equal to each other in standby state, sub-threshold leakage does not occur at all between the source and drain of a memory cell. In active state, a potential difference is produced between the bit lines and the source lines. Thus, a control technique wherein a potential difference is produced between the bit lines and the source lines depending on whether memory cells are selected or unselected is not adopted. Therefore, the speed of operation of reading data out of the memory is not lowered.

If the potential of the source lines is made equal to the precharge potential of the bit lines on standby, the source lines are discharged in response to an instruction to transition from standby state to active state. Then, the current supplying capability thereof is varied so that the discharge rate will be enhanced stepwise. Thus, currents are prevented from concentratedly flowing from a large number of memory cells to the source lines at a time. As a result, the production of relatively large noise is prevented.

DETAILED DESCRIPTION OF THE PREFERRED EMBODIMENTS

Figure 1:
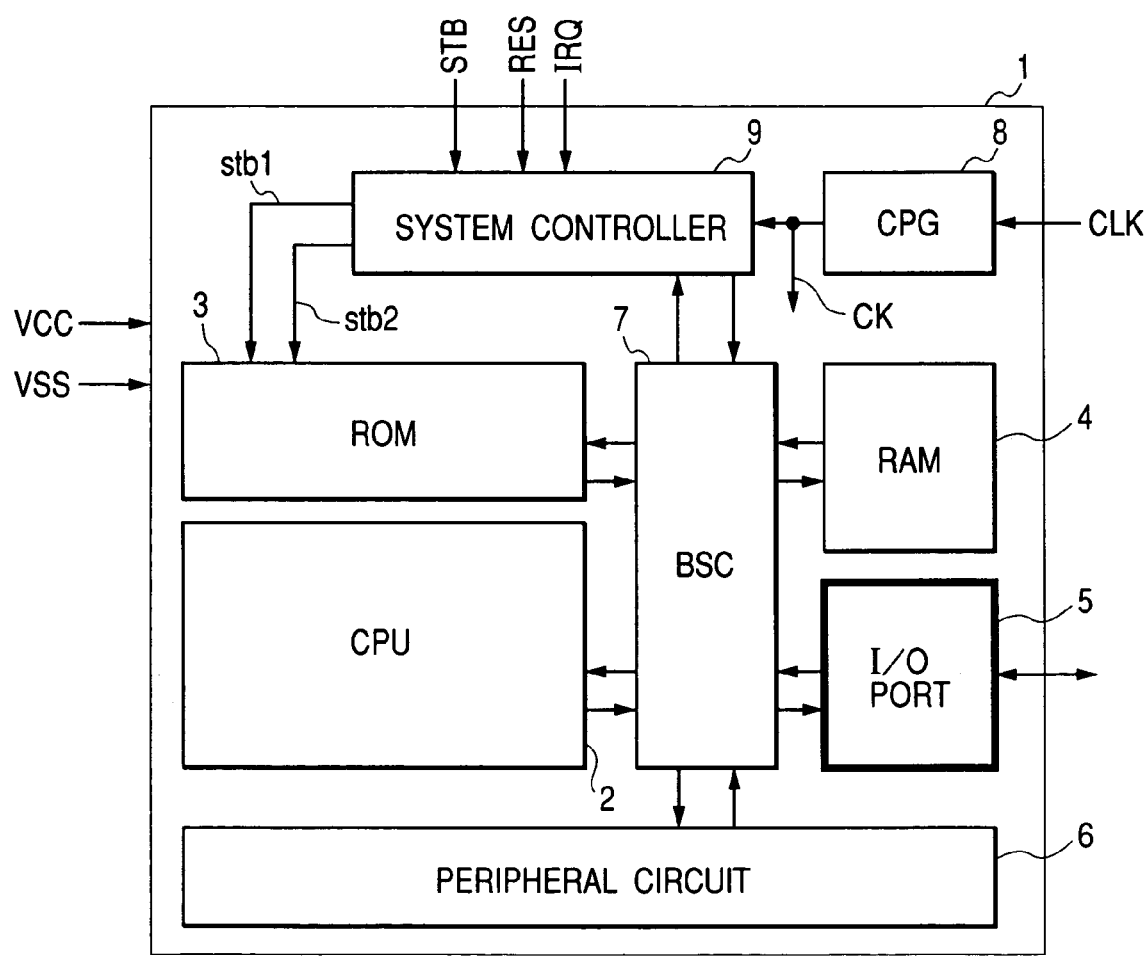
FIG. 1 is a block diagram illustrating a microcomputer based on the semiconductor integrated circuit according to the present invention.

FIG. 1 illustrates a microcomputer as an example of the semiconductor integrated circuit according to the present invention. The microcomputer 1 illustrated in the figure is formed on a semiconductor substrate (semiconductor chip) of single crystal silicon or the like, for example, by CMOS integrated circuit manufacturing technology. The microcomputer 1 receives supply voltage VCC and the ground voltage VSS of the circuit as operating power supply.

The microcomputer 1 comprises a central processing unit (CPU) 2, a read only memory (ROM) 3 which holds operating programs and the like for the CPU 2; a random access memory (RAM) 4 used as a work area for the CPU 2 or for like purposes; I/O ports 5 connected with an external bus and the like; a peripheral circuit 6 of a timer and the like; a bus controller (BSC) 7, a clock pulse generator (CPG) 8, and a system controller 9.

The CPU 2 comprises an instruction control part which decodes instructions fetched from the ROM 3 and controls instruction execution; and an operation part which carries out operand access, operation, and the like under the control of the instruction control part. The bus controller 7 carries out bus control with respect to number of access cycles, number of parallel data bits, and the like according to access addresses from the CPU 2. The system controller 9 is fed with reset signals RES, standby signals STB, interrupt signals IRQ, and the like, and carries out operation mode control and interrupt control. The clock pulse generator 8 receives external clock signals CLK and generates internal clock signals CK. The microcomputer 1 is operated in synchronization with the internal clock signal CK. When reset operation is instructed by a reset signal RES, the microcomputer 1 is internally initialized. When reset is released, the CPU 2 starts instruction execution at the starting address with respect to programs in the ROM 3.

The microcomputer 1 has standby state and active state. "Active state" is a state in which the CPU 2 is capable of processing data in synchronization with the clock signal CK and the access operation of the ROM 3 and the RAM 4 is enabled by the CPU 2 and the like. After reset is released, the microcomputer 1 is brought into active state, though this is not an absolute requisite. Entrance into standby state is instructed by the standby signal STB, an external control signal, though this is not restricted. Alternatively, it is instructed by the CPU 2 setting a standby flag (not shown) on the system controller 9. "Standby state" is a state in which the operations of the CPU 2, the ROM 3, and the like are stopped. That is, it is a state in which the CPU 2 is incapable of processing data and the access operation of the ROM 3 and the like is disabled by the CPU 2. Standby state is also referred to as "wait state" or "low-power consumption state." More particularly, it is a state in which, for example, the clock generating operation of the CPG 8 is stepped; the operation of the CPU 2 is stopped (the contents of the internal registers are maintained); information stored in the RAM 4 is maintained; the operation of the peripheral circuit 6 is stopped; and the operation of the ROM 3 is stopped. The standby state of the microcomputer 1 (also referred to as "chip standby state") is also a state in which the operation of the ROM 3 is stopped, that is, the standby state of the ROM 3.

The ROM 3 has a large capacity sufficient to hold the operating programs for the CPU 2 and data tables, and comprises a mask ROM. Therefore, when reduction of the power consumption of the microcomputer 1 in standby state is considered, it is important to reduce power wastefully consumed in the ROM 3 whose operation is stopped. For example, reducing the power consumption therein due to leakage current is important. In consideration of this, the ROM, especially, a state in which the operation of the ROM 3 is stopped will be described in detail. The microcomputer 1 is brought into standby state by a standby signal STB or a standby flag (not shown). At this time, the system controller 9 stops the operation of the ROM 3 and controls the status of the ROM 3 by control signals stb1 and stb2. Stoppage of the operation of the ROM 3 is implemented by stopping the clock signal CK and bringing the ROM into module unselect state. The signals stb1 and stb2 are utilized in leakage current suppression described later. Bringing the ROM 3 into module select state is effected by the CPU 2 carrying out instruction execution. For example, The bus controller 7 decodes an output address from the CPU 2 and outputs a module select signal to the ROM 3. If the CPU 2 stops operation when the microcomputer 1 is in standby state, the ROM 3 is brought into module unselect state.

Figure 2:
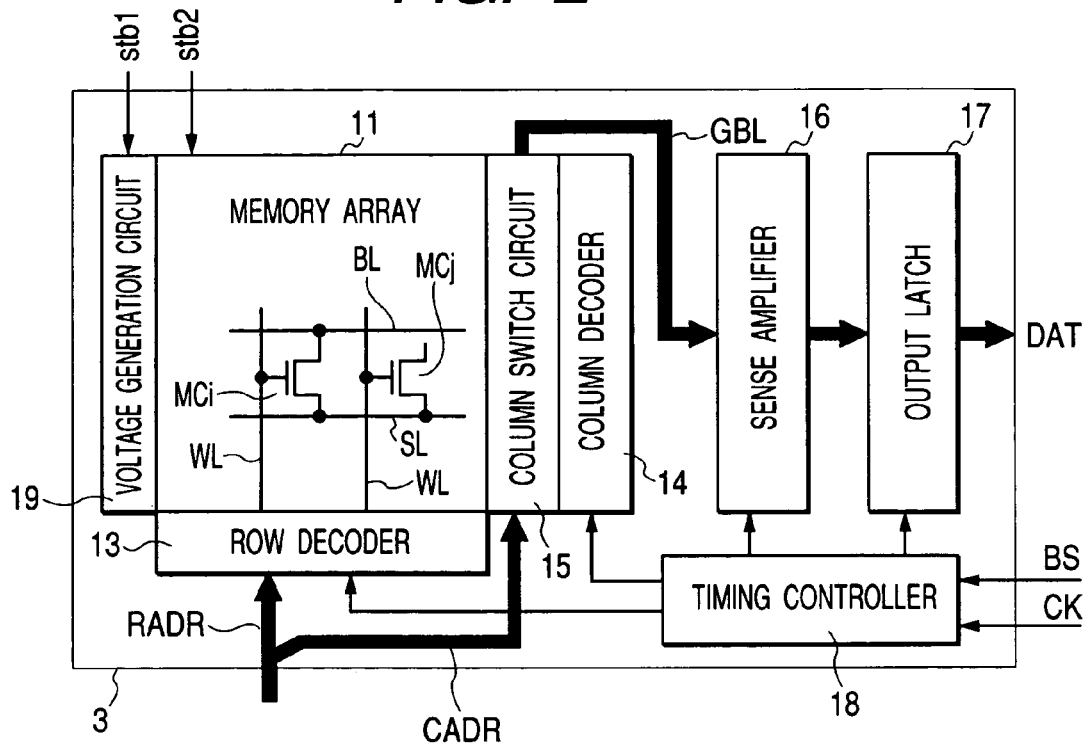
FIG. 2 is a block diagram illustrating ROM incorporated in the microcomputer in detail.

FIG. 2 illustrates an example of the ROM 3. The memory array 11 has a large number of memory cells which store information. The memory cells MCi and MCj are formed of n-channel MOS transistors, though this is not an absolute requisite. The logical value, "1" or "0," of stored information is determined by the presence or absence of contact between drains and bit lines. That is, the logical value is determined according to whether drains are connected with bit lines through contact holes. The memory cells may be those of such a storage method that information is stored according to the presence or absence of a diffusion region of source and drain. The memory cell MCi representatively shown has a contact, and the memory cell MCj representatively shown does not have a contact. The sources of the memory cells MCi and MCj are connected with a source line SL, and the gates thereof as select terminals are connected with word lines WL. A row decoder 13 decodes row address signals RADR to form word line select signals. The bit line BL is connected with a global bit line (also referred to as "common data line") GBL through a column switch circuit 15. A column decoder 14 decodes column address signals CADR and generates bit line select signals for the column switch circuit 15. The bit line BL selected by the column switch circuit 15 is provided with continuity to the global bit line GBL. The global bit lines GBL are provided with a sense amplifier 16, which detects and amplifies stored information outputted to global bit lines GBL. The output of the sense amplifier 16 is latched into an output latch 17 and then outputted to the outside. External output data is represented as DAT in the figure. A timing controller 18 is fed with clock signals CK and module select signals BS for the ROM 3, and generates internal timing signals. The module select signal BS is outputted from the bus controller 7, though this is not an absolute requisite. The voltage generation circuit 19 is a circuit for precharging and discharging bit lines BL and source lines SL.

Figure 3:
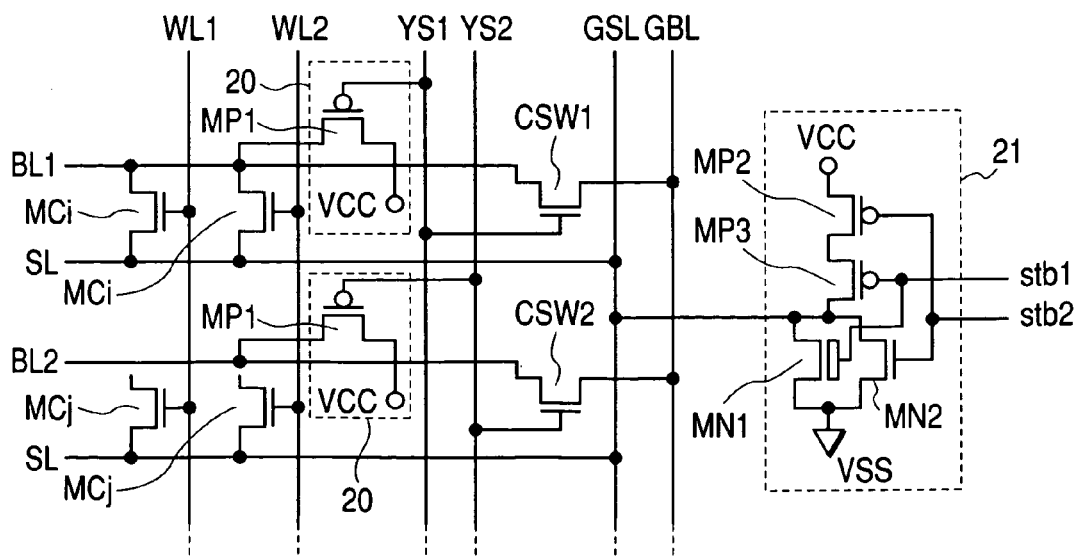
FIG. 3 is a schematic circuit diagram illustrating the constitution of a part of a global bit line equivalent to one bit as the details of a memory array and voltage generation circuits.

FIG. 3 illustrates the constitution of a part of the global bit lines GBL equivalent to one bit as the details of the memory array 11 and the voltage generation circuit 19.

In the figure, the bit lines BL1 and BL2 and source lines SL representatively shown are laid in the X direction, and the word lines WL1 and WL2 representatively shown are laid in the Y direction. The bit line BL1 is connected with the drains of the memory cells MCi representatively shown, and the sources of the memory cells MCi are connected with the corresponding source lines SL. The drains of the memory cells MCj representatively shown are not connected with the bit line BL2, and the sources thereof are connected with the corresponding source line SL. The bit line BL1 can be provided with continuity to the global bit line GBL through a column switch CSW1, and the bit line BL2 can be provided with continuity to the global bit line GBL through a column switch CSW2. A bit line select signal YS1 representatively shown controls the switching of the column switch CSW1 and a bit line select signal YS2 representatively shown controls the switching of the column switch CSW2. Those of the bit line select signals YS1 and YS21 corresponding to bit lines specified by column address signals are set to a logical value of "1." The column switches CSW1 and CSW2 are formed of n-channel MOS transistors; however, the switches CSW1 and CSW2 may be formed of CMOS transfer gates. The column switches CSW1 and CSW2 representatively shown constitute the column switch circuit 15.

The voltage generation circuit 19 comprises a precharge circuit 20 and a charge and discharge circuit 21. The precharge circuit 20 is provided for each bit line represented by BL1 and BL2, and has a p-channel precharge MOS transistor MP1. The precharge circuit 20 is capable of selectively precharging the bit line BL1 (BL2) to supply voltage VCC. This is implemented by the precharge MOS transistor MP1 the switching of which is controlled by the bit line select signal YS1 (YS2). Thus, the precharge circuit 20 performs precharge operation when the bit line is not selected by a bit line select signal (bit line select signal YS1, YS2=0 (LOW level)). Further, the precharge circuit 20 stops precharge operation when the bit line is selected by a bit line select signal (bit line select signal YS1, YS2=1 (HIGH level)).

The charge and discharge circuit 21 comprises p-channel MOS transistors MP2 and MP3 in serial two stages; and n-channel MOS transistors MN1 and MN2 in parallel two stages. In response to two inputs of internal standby signals stb1 and stb2, the charge and discharge circuit 21 drives the source lines SL and GSL with NOR logic. One charge and discharge circuit 21 is placed for one source line GSL to which every eight source lines are connected in common, though this is not an absolute requisite.

The internal standby signals stb1 and stb2 are brought to LOW when the microcomputer 1 enters standby state. When the microcomputer 1 transitions from standby state to active state, the internal standby signal stb1 is brought to HIGH, and then the internal standby signal stb2 is brought to HIGH.

The MOS transistors MP2 and MP3 which receive the internal standby signals stb 1 and stb2 at their gates charge the source lines to supply voltage VCC when the microcomputer 1 transitions to standby state. Thus, when the microcomputer 1 is in standby state, all the bit lines represented by BL1 and BL2 and all the source lines represented by SL and GSL are brought to supply voltage VCC. Thus, a potential difference is not produced between the source and drain of each memory cell MCi, and sub-threshold leakage does not occur there.

The MOS transistor MN1 which receives the internal standby signal stb1 at its gate is a transistor whose gate length is relatively large and whose on-resistance is relatively high. The MOS transistor MN2 which receives the internal standby signal stb2 at its gate is the same transistor as the majority of the other n-channel MOS transistors whose gate length is shorter than that of the above MOS transistor MN1. Thus, when the microcomputer 1 transitions to active state, the discharge rate for the source lines is low at first and thereafter enhanced. As a result, currents are prevented from flowing from all the source lines into ground voltage wires at the same time. Thus, a break in the ground voltage wires due to migration and the production of large power supply noise can be reduced.

Figure 4:
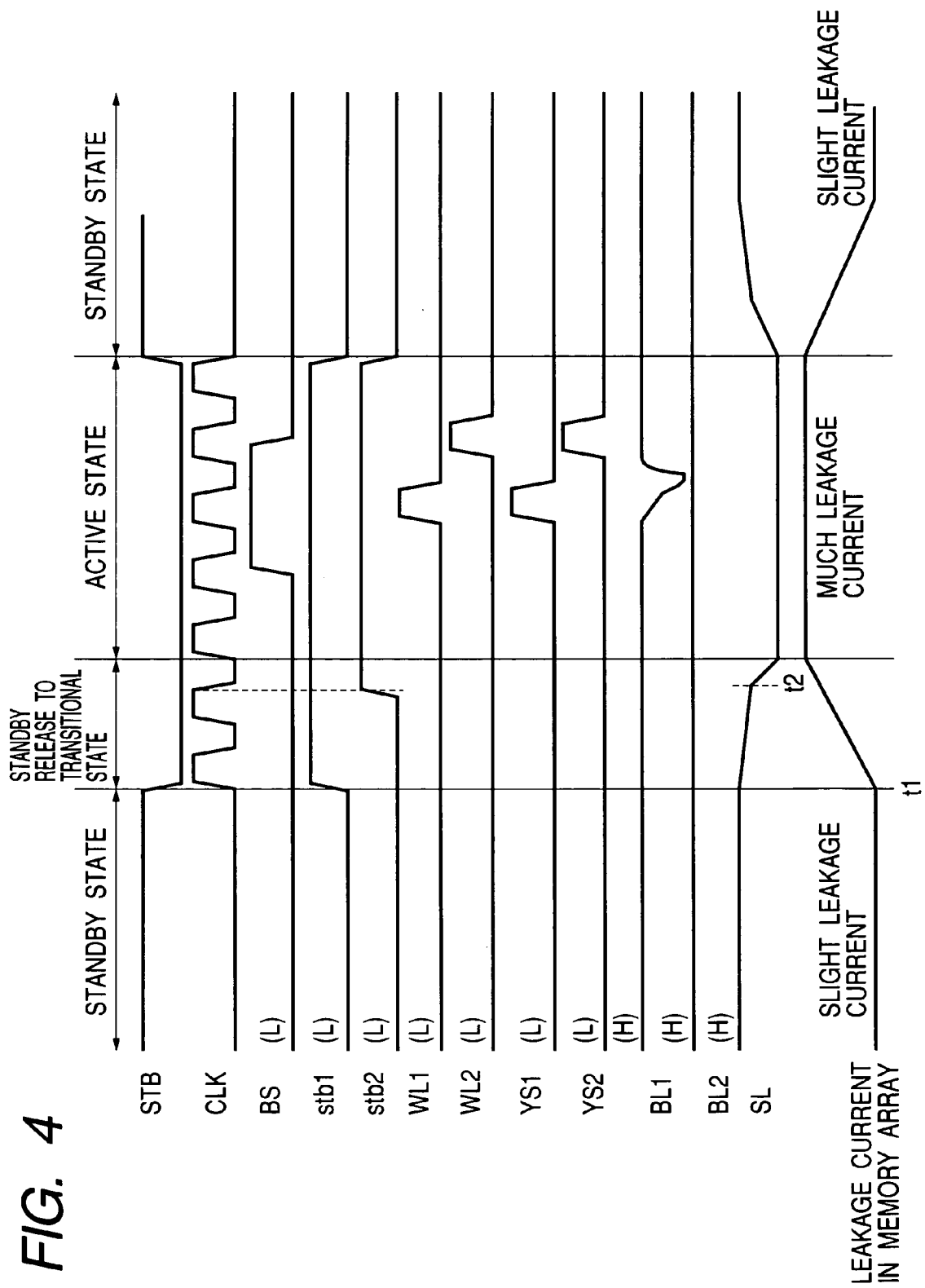
FIG. 4 is a timing chart illustrating the operation timing of the ROM in FIG. 2.

FIG. 4 illustrates the operation timing of the ROM. In FIG. 4, the microcomputer 1 is initially in established standby state (chip standby state). Then, the microcomputer 1 transitions to active state after it goes through standby release to transitional state. When the microcomputer 1 is in standby state, the clock signal CK is stopped, and the module select signal BS to the ROM 3 is in unselect state. Further, the internal standby signals stb1 and stb2 are at LOW. Thus, the operation of the ROM 3 is stopped, and both the bit lines BL1 and BL2 and the source lines SL are charged to supply voltage VCC. Thus, sub-threshold leakage is prevented from occurring between the drain and source of each memory cell in the memory array 11 of the ROM 3.

At time t1, the standby signal STB provides an instruction to release the standby state of the microcomputer 1. Thus, the operation of the CPG 8 is restarted, and the internal standby signal stb1 supplied to the ROM 3 is brought to HIGH. Thereafter, the internal standby signal stb2 is brought to HIGH with a delay of, for example, several cycles of the clock signal CK. Thus, the potential of the source lines SL is discharged at a relatively moderate rate for the period from time t1 to time t2. At time t2 and later, the source lines SL are discharged at a higher rate. After chip standby release to transitional state, the source lines SL are charged to ground potential VSS, and the bit lines BL1 and BL2 are charged to supply voltage VCC. Thereafter, the ROM 3 is brought into module select state by the module select signal BS, and an address signal is given. As a result, for example, the word line WL1 is selected, and the bit line BL1 is selected by the bit line select signal YS1. If a memory cell connected with the selected bit line BL1 and word line WL1 has a drain contact, a charge current is pulled from the bit line BL1 to ground voltage VSS through the memory cell transistor. Then, the word line WL2 is selected, and the bit line BL2 is selected by the bit line select signal YS2. If a memory cell connected with the selected bit line BL2 and word line WL2 does not have a drain contact, the electric charges precharged in the bit line BL2 are maintained.

When the microcomputer 1 is in standby state, both the bit lines and the source line are charged to supply voltage VCC. Thereby, sub-threshold leakage is prevented from occurring between the drain and source of each memory cell in the memory array 11 of the ROM 3. In active state, a potential difference equivalent to supply voltage VCC is produced between unselected bit lines and source lines, and a sub-threshold leakage current is increased as compared with in standby state. However, some microcomputers are kept in standby state or in process wait state for the most part of time depending on the applications thereof. Such applications include controlling of equipment which has charge of processing transmit/receive data and transfer data. In consideration of these applications, it is important to suppress sub-threshold leakage currents in the ROM 3, an on-chip large-capacity memory, even in standby state. It is important for accomplishing reduction of the power consumption of the entire system, and is highly effective in reducing power consumed.

Figure 5:
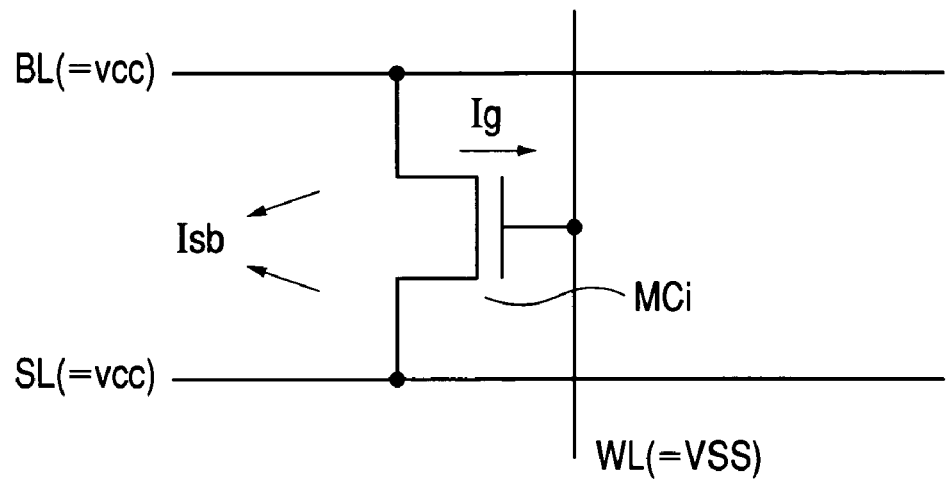
FIG. 5 is an explanatory drawing illustrating a leakage current produced in a memory cell in standby state.

FIG. 5 illustrates a leakage current produced in a memory cell in chip standby state. Both the bit line BL and the source line SL are brought to supply voltage VCC; therefore, sub-threshold leakage does not occur between source and drain. Gate leakage currents (Ig) between gate and drain and between gate and source and leakage currents (Isb) to the substrate are produced. However, they are slight in amount, and are much smaller in amount as compared with sub-threshold leakage between source and drain.

Figure 6:
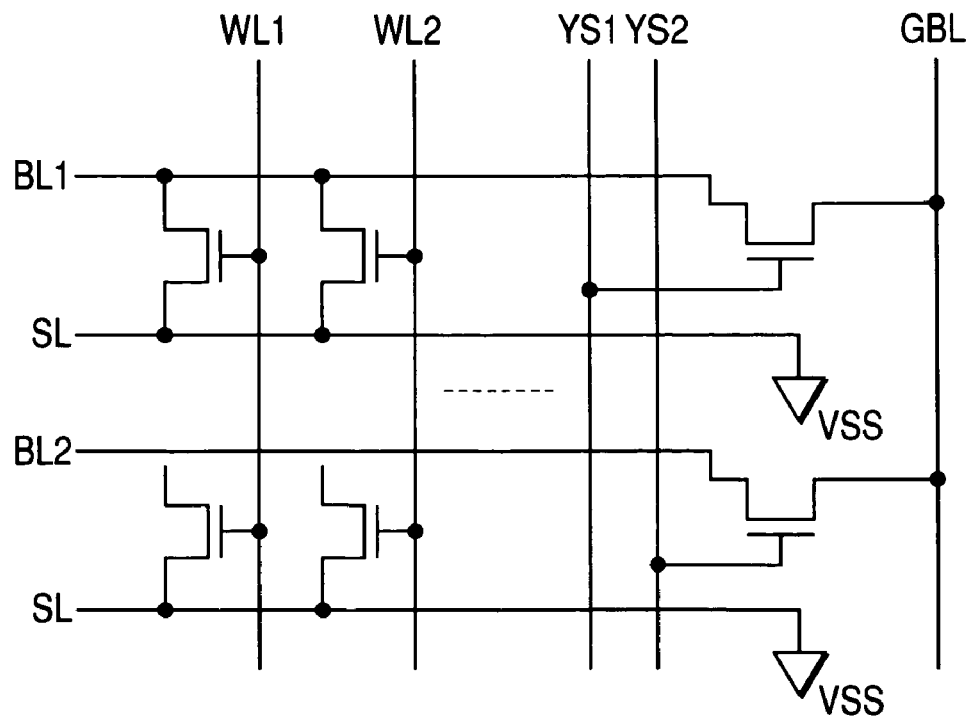
FIG. 6 is a schematic circuit diagram illustrating a part of a memory array in a comparative example to the present invention.
Figure 7:
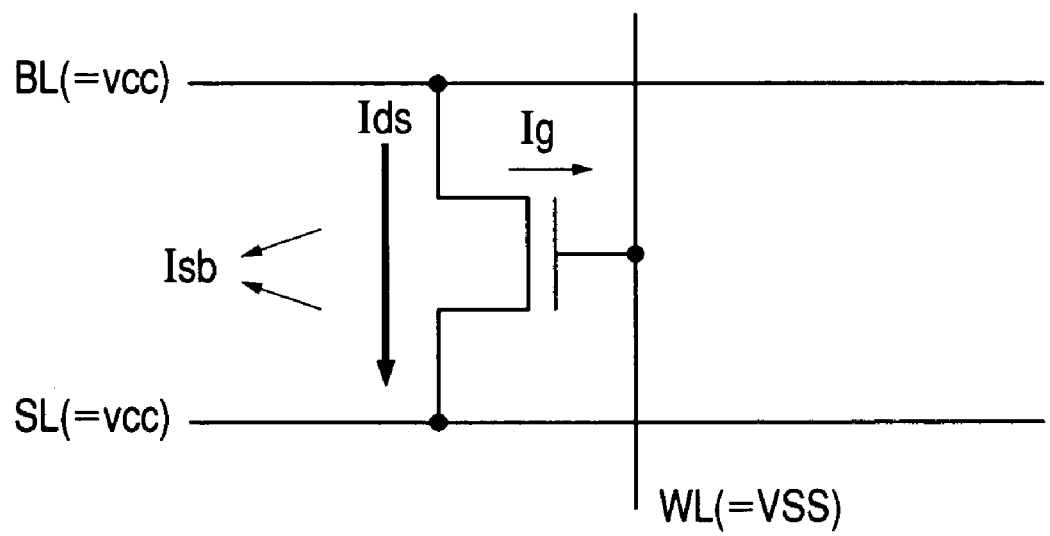
FIG. 7 is an explanatory drawing illustrating a leakage current in the memory array in FIG. 6.
Figure 8:
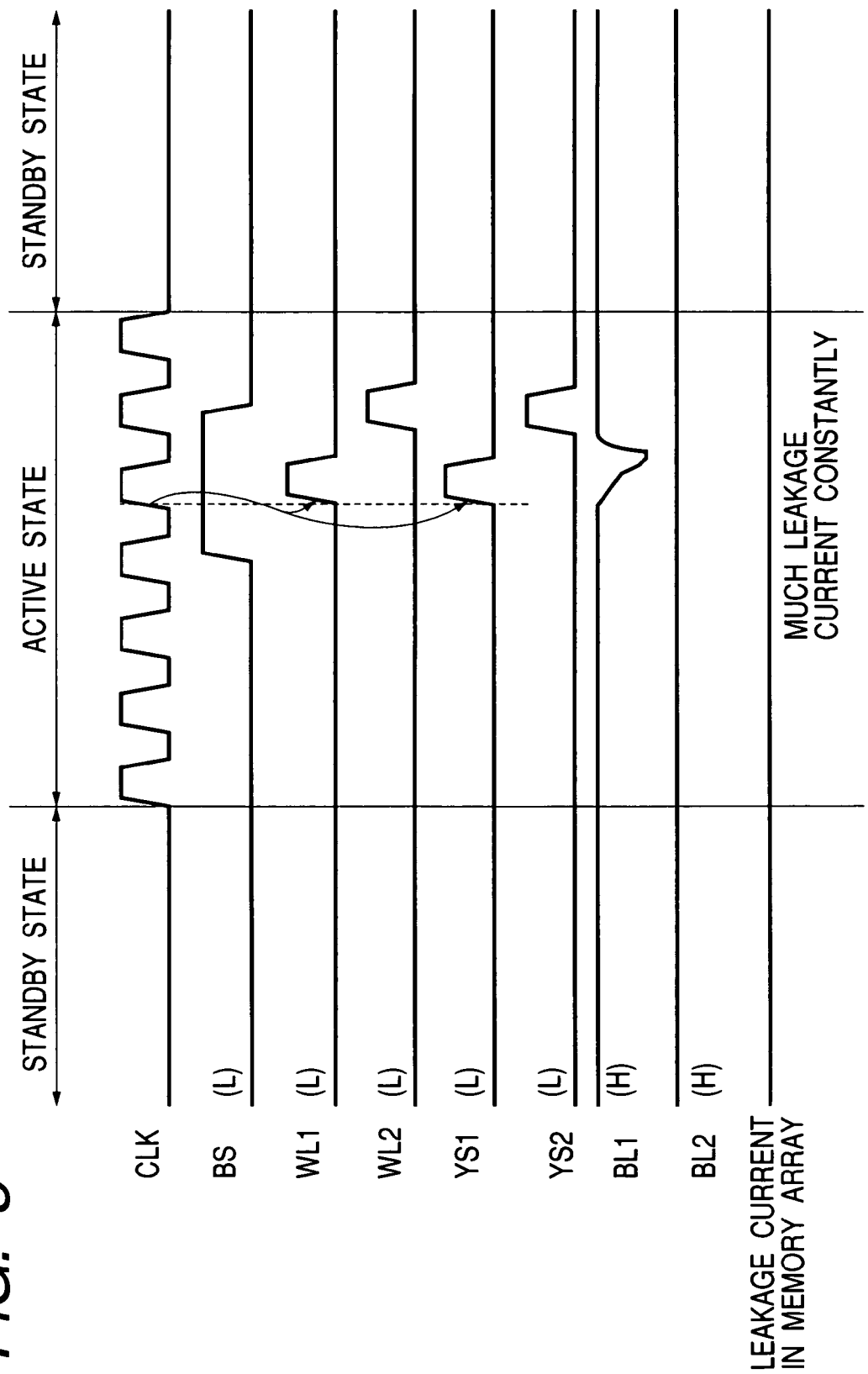
FIG. 8 is a timing chart illustrating the operation timing in the comparative example in FIG. 6.

FIG. 6 illustrates a part of the circuit of the memory array in a comparative example to the present invention. The source lines SL are constantly connected to the ground voltage VSS of the circuit. Even in standby state, a potential difference equivalent to supply voltage VCC is produced between the bit lines BL and the source lines SL. Thus, in this memory array, a sub-threshold leakage current is produced both in standby state and in active state. FIG. 7 illustrates leakage currents in the memory array illustrated in FIG. 6. A sub-threshold leakage current Ids is produced between drain and source. However, the access rate is substantially the same as in FIG. 3. FIG. 8 illustrates the operation timing in the comparative example illustrated in FIG. 6. In this memory array, leakage currents, such as Ids, are constantly produced both in standby state and in active state, and it is difficult to accomplish the reduction of power consumption.

Figure 9:
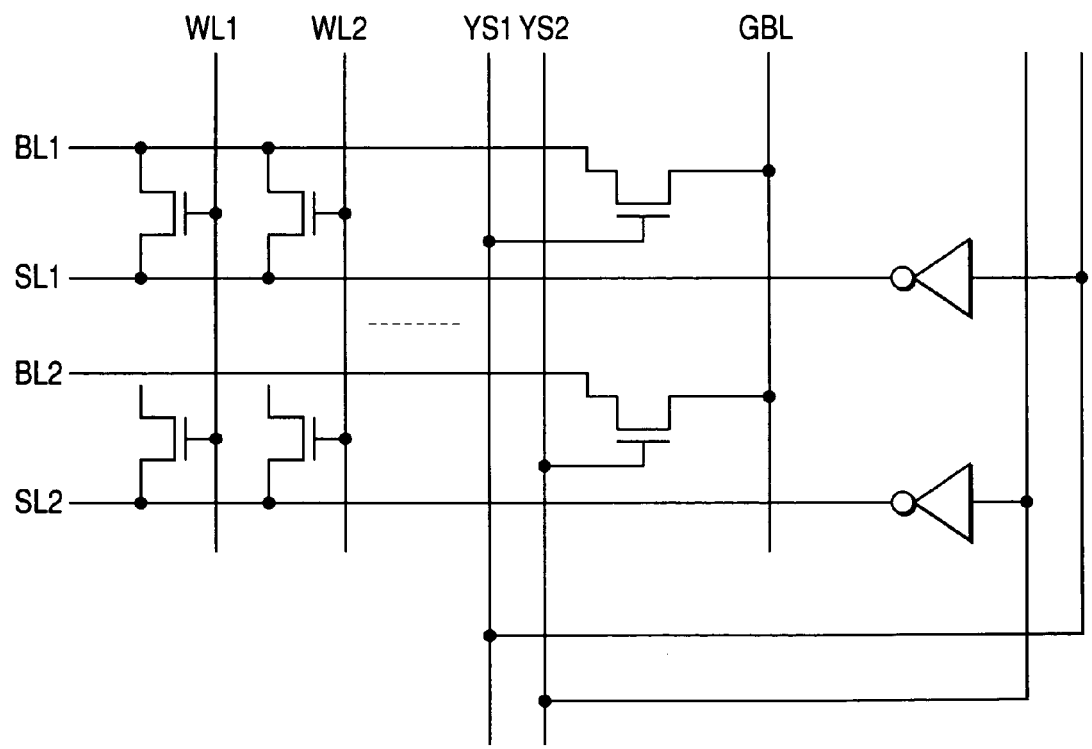
FIG. 9 is a schematic circuit diagram illustrating a part of the memory array in another comparative example to the present invention.
Figure 10:
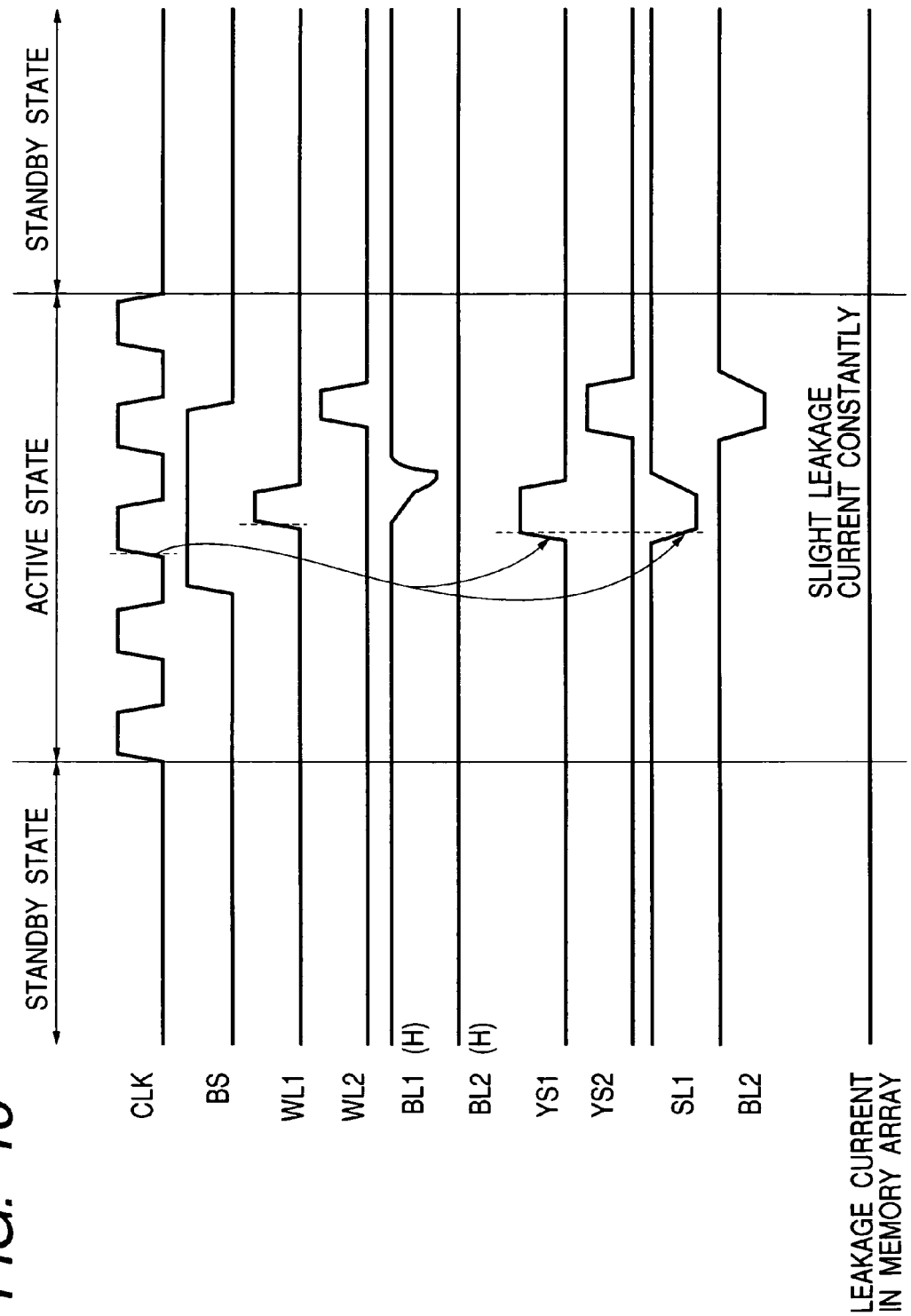
FIG. 10 is a timing chart illustrating operation timing in relation to FIG. 9.

FIG. 9 illustrates a part of the circuit of the memory array in another comparative example to the present invention. The source lines SL are individually discharged in parallel with corresponding bit lines being selected by a bit line select signal when the microcomputer is in active state. Therefore, in addition to the selection of the corresponding bit lines, the source lines are precharged to the same level as the bit lines. Thus, a leakage current in the memory array is always small in amount. As in FIG. 5, substantially no sub-threshold leakage occurs between drain and source. However, source lines are discharged before word lines are selected and readout operation is performed. Therefore, as indicated by the operation timing illustrated in FIG. 10, the cycle of readout operation is longer than in the examples in FIG. 3 and FIG. 6. That is, fast access to the ROM is impossible.

Figure 11:
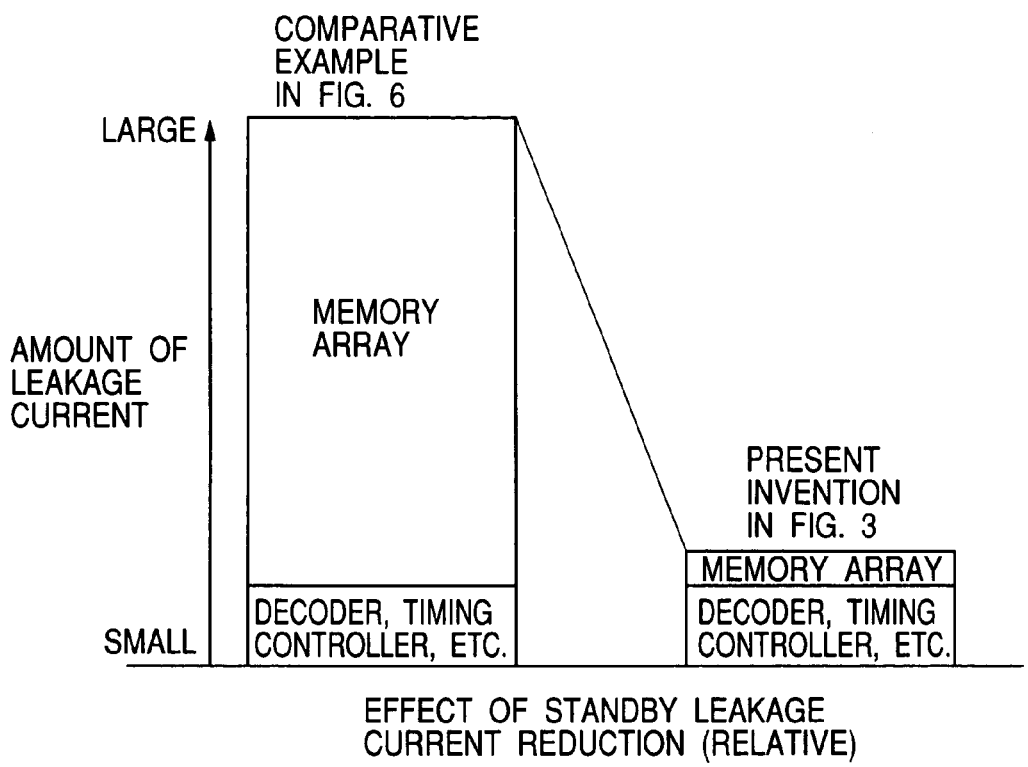
FIG. 11 is an explanatory drawing illustrating the effect of leakage current reduction on standby in the present invention in FIG. 3 and that in the comparative example in FIG. 6.

FIG. 11 illustrates the effect of leakage current reduction on standby in the present invention illustrated in FIG. 3 and that in the comparative example illustrated in FIG. 6. According to the present invention, the leakage current on standby is significantly reduced.

Figure 12:
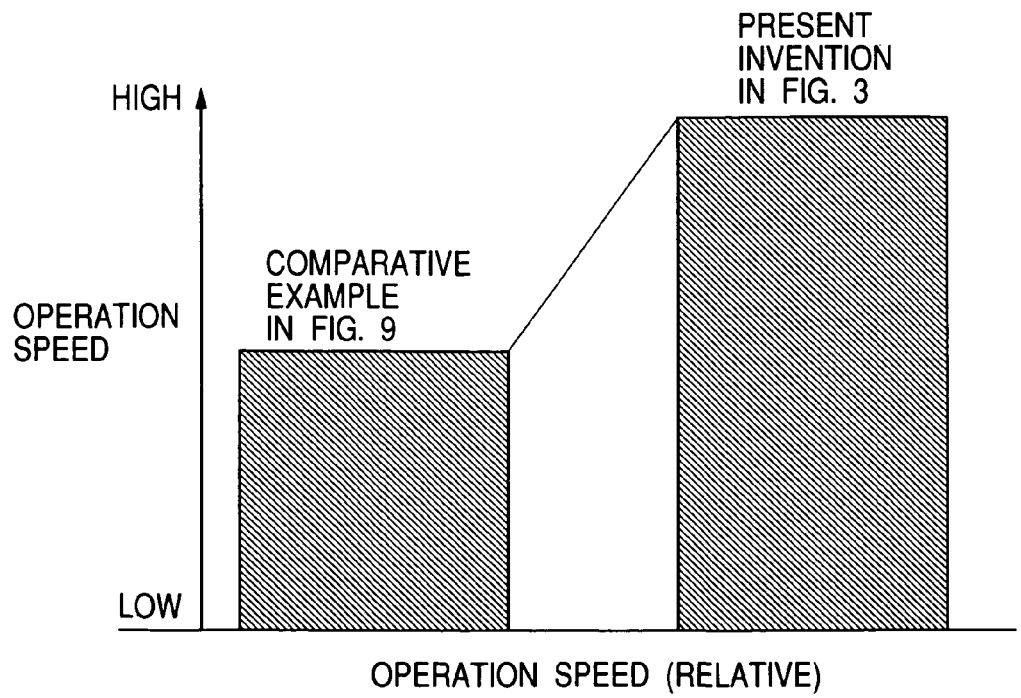
FIG. 12 is an explanatory drawing illustrating a difference in operation speed between the present invention in FIG. 3 and the comparative example in FIG. 9.

FIG. 12 illustrates a difference in operation speed between the present invention illustrated in FIG. 3 and the comparative example illustrated in FIG. 9. According to the present invention, the bit line potential or the source line potential is not varied in active state. Therefore, faster access operation is possible as compared with the case in FIG. 9.

Figure 13:
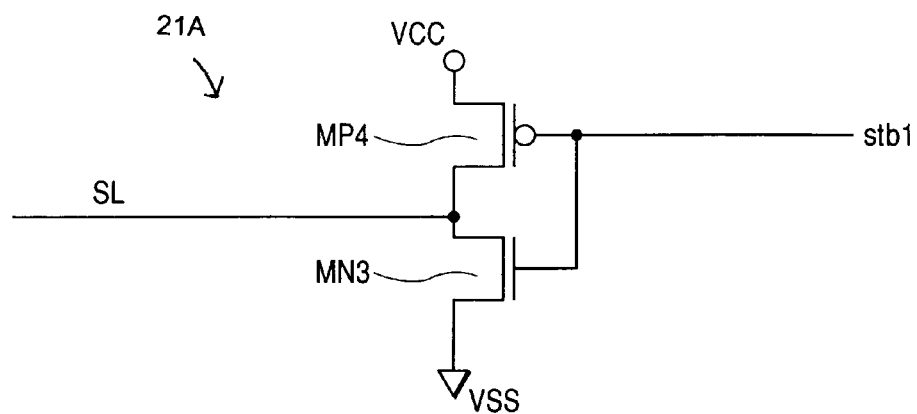
FIG. 13 is a schematic circuit diagram illustrating another example of a charge and discharge circuit for source lines.
Figure 14:
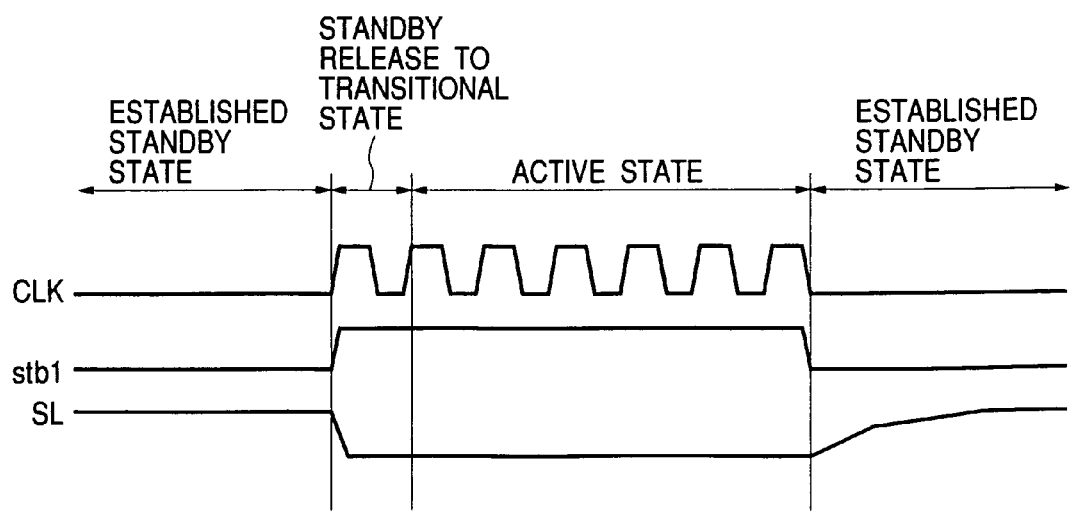
FIG. 14 is a timing chart illustrating operation timing in relation to FIG. 13.

FIG. 13 illustrates another example of a charge and discharge circuit for source lines. The charge and discharge circuit 21A illustrated in the figure comprises a CMOS inverter controlled by the internal standby signal stb1. A p-channel MOS transistor MP4 has a relatively large gate length and a relatively high on-resistance. An n-channel MOS transistor MN3 has a relatively large gate width and a relatively low on-resistance. As illustrated by the timing chart in FIG. 14, this charge and discharge circuit 21A allows the reduction of the duration of standby release to transitional state. However, an overcurrent flows to the ground voltage VSS of the circuit during discharging. Therefore, ground potential wires which withstand that and special measures against noise are required. High speed is not required for transition from active state to standby state in terms of operation. Therefore, it is unnecessary to charge the source lines SL at high speed, and accordingly the power supply system does not require measures against overcurrent during charging.

Figure 15:
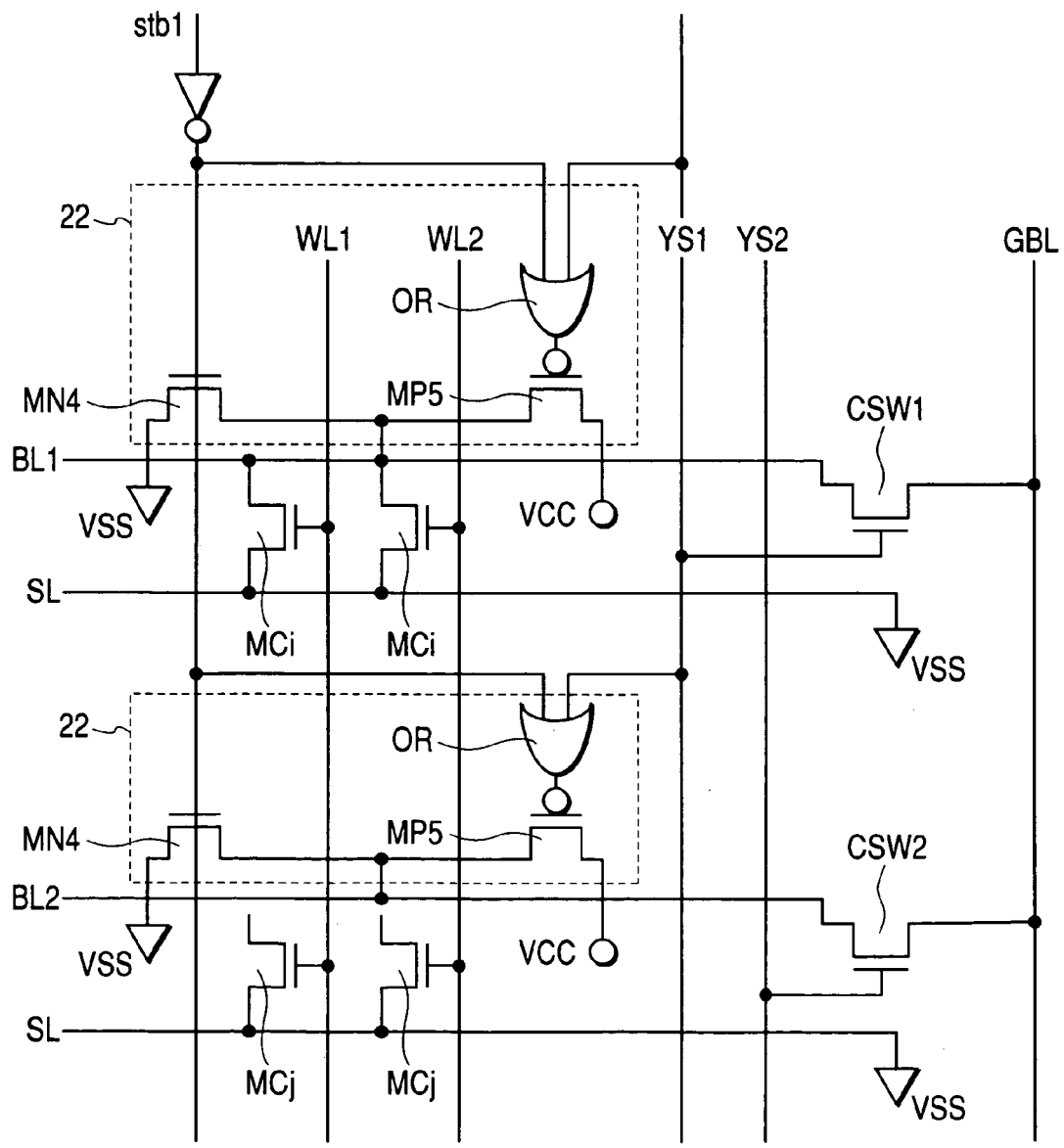
FIG. 15 is a schematic circuit diagram illustrating another example of voltage generation circuits in a memory array.

FIG. 15 illustrates another example of a voltage generation circuit in a memory array. In the figure, the voltage generation circuit 19 comprises a charge and discharge circuit 22. The charge and discharge circuit 22 is placed for each bit line represented by BL1 and BL2. Each source line SL is constantly connected with the ground voltage VSS of the circuit. One charge and discharge circuit 22 may be placed for a plurality of bit lines, though this constitution is not illustrated.

The charge and discharge circuit 22 comprises an n-channel MOS transistor MN4, a p-channel MOS transistor MP5, and two-input logical add (OR) gate OR. The switching of the MOS transistor MN4 is controlled by the inversion signal of the internal standby signal stb1. In standby state, the MOS transistor MN4 discharges the bit line to the ground voltage VSS of the circuit. In active state, the MOS transistor MN4 is brought into off-state. The logical add gate OR is fed with the corresponding bit line select signal and the inversion signal of the internal standby signal stb1. In active state (stb1=1), the logical add gate OR operates as follows: when the corresponding bit line select signal is at unselect level (LOW), the logical add gate OR turns on the corresponding MOS transistor MP5 to precharge the bit line. When the bit line select signal is at bit line select level (HIGH), the logical add gate OR cuts off the MOS transistor MP5 to stop the precharge operation. In standby state (stb1=0), the logical add gate OR constantly cuts off the MOS transistor MP5 to suppress bit line precharge.

In standby state, therefore, the charge and discharge circuits 22 discharge all the bit lines represented by BL1 and BL2 to the same ground voltage as the source lines SL. As a result, a potential difference is not produced between the source and drain of each memory cell Mci, and sub-threshold leakage does not occur there. Especially, in standby state, the word lines are brought to unselect level which is equivalent to the ground voltage VSS of the circuit. Thus, a leakage current between drain and gate is also prevented from occurring.

FIG. 3 and FIG. 15 will be compared with each other. In case of FIG. 15, a logical add gate is required for each bit line, and the logical scale of the voltage generation circuits 19 is increased. The voltage generation circuit 19 in FIG. 3 which comprises the precharge circuit 20 and the charge and discharge circuit 21 can be constituted with small logical scale as a whole. This will be further described in detail. In the constitution in FIG. 3, the source lines only have to be at the discharge level in active state and the potential thereof need not varied at some point or another. Therefore, provision of a circuit for making the potential of the source lines equal to the precharge potential of the bit lines in standby state hardly has influences on the operation in active state. The circuitry can be simplified. In other words, application of the present invention to a conventional circuit does not require addition of a new circuit to the periphery of the bit lines. Therefore, load fluctuation does not occur around the bit lines, which saves time and labor for redesigning. In case of FIG. 15, circuitry wherein the bit lines are discharged in standby state is added to the periphery of the bit lines. Therefore, some measures will be probably required for applying this to a conventional circuit. Such measures include a contrivance for suppressing load fluctuation around bit lines and reconsideration of operation timing margin. This constitution will probably increase time and labor for redesigning as compared with a constitution wherein the source lines are charged to the bit line precharge level on standby. That is, the constitution illustrated in FIG. 3 is superior for minimizing the time and labor for design change and the additional logical scale when the present invention is applied to a conventional circuit.

Figure 16:
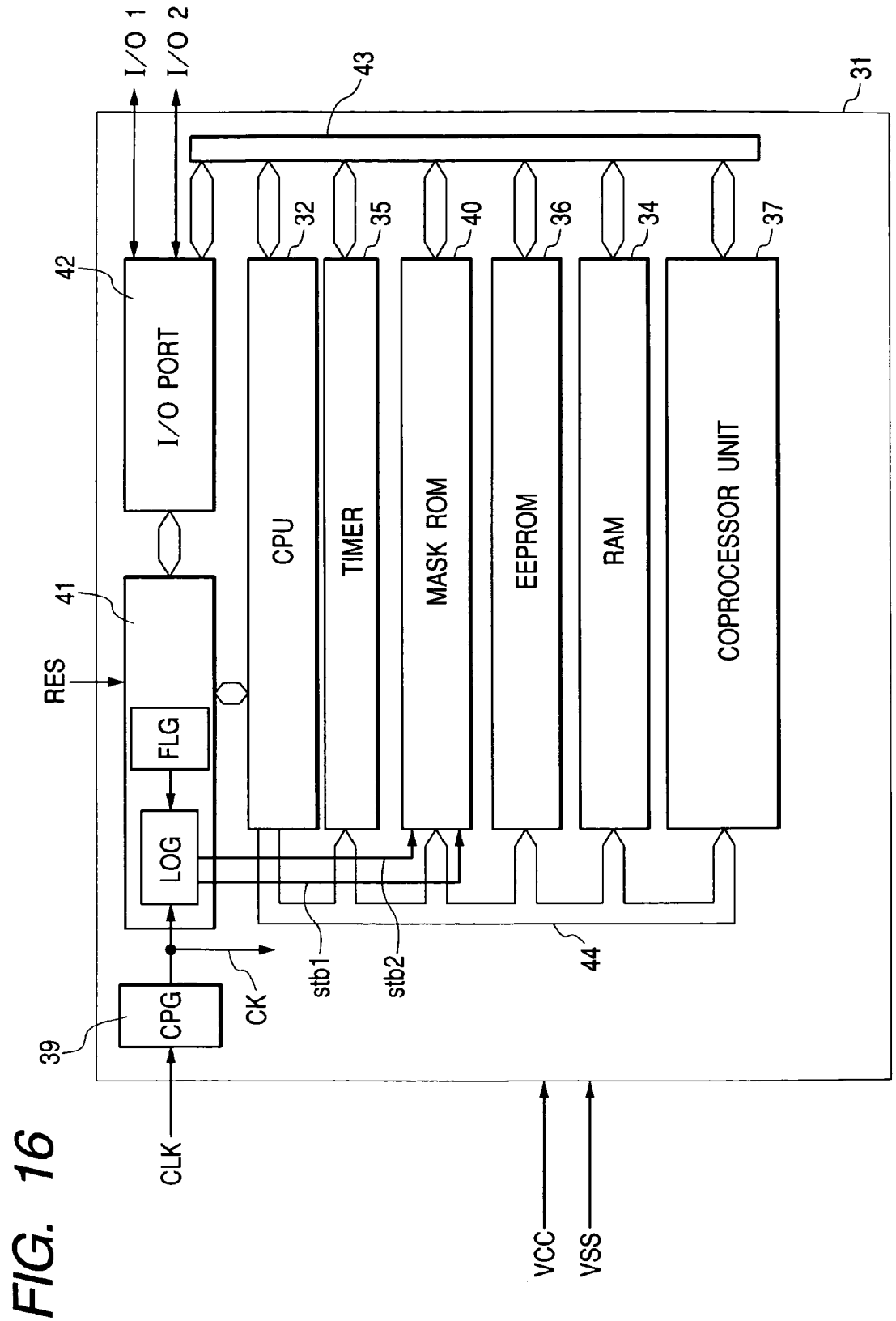
FIG. 16 is a block diagram illustrating an IC card microcomputer as another example of the microcomputer.

FIG. 16 illustrates another example of the microcomputer. The microcomputer 31 illustrated in the figure is a microcomputer for IC card (so-called IC card microcomputer), though this is not an absolute requisite. The microcomputer 31 illustrated in the figure is formed, on a semiconductor substrate or semiconductor chip, of single crystal silicon or the like, for example, by CMOS semiconductor integrated circuit manufacturing technology.

The microcomputer 31 comprises CPU 32; RAM (Random Access Memory) 34 as work RAM; a timer 35; EEPROM (Electrically Erasable and Programmable Read Only Memory) 36; a coprocessor unit 37; a clock pulse generator (CPG) 39; a mask ROM (Read Only Memory) 40; a system controller 41; an I/O port (Input/Output port) 42; a data bus 43; and an address bus 44.

The mask ROM 40 is used to store operating programs (encryption program, decryption program, interface control program, and the like) for the CPU 32 and data, and has the configuration described in relation to FIG. 2. The RAM 34 is used as the work area for the CPU 32 or the temporary storage area for data. It comprises, for example, SRAM (Static Random Access Memory) or DRAM (Dynamic Random Access Memory). The CPU 32 fetches instructions from the mask ROM 40 and decodes the fetched instructions. Then, based on the result of the decoding, the CPU 32 performs operand fetch and data processing. The coprocessor unit 37 performs varied processing, such as remainder computation in RSA public-key cryptography or Elliptic Curve Cryptography under the control of the CPU 32. The I/O port 42 has two-bit input/output terminals I/O1 and I/O2, and is used both for input/output of data and input of external interrupt signals. The I/O port 42 is coupled with the data bus 43, and the data bus 43 is connected with the CPU 32, RAM 34, timer 35, EEPROM 36, coprocessor unit 37, and the like. In the microcomputer 31, the CPU 32 functions as the bus master module, and is capable of outputting address signals to the address bus 44 connected with the RAM 34, timer 35, EEPROM 36, mask ROM 40, and coprocessor unit 37. The system controller 41 controls the operation mode of the microcomputer 31 and interrupts.

Further, The system controller 41 has random number generation logics used for generating encryption keys. RES is the reset signal to the microcomputer 31. When reset operation is instructed by a reset signal RES, the microcomputer 31 is internally initialized, and the CPU 32 starts instruction execution at the starting address with respect to programs in the mask ROM 40. The clock pulse generator 39 receives external clock signals CLK and generates internal clock signals CK. The microcomputer 31 is operated in synchronization with the internal clock signal CK.

In the EEPROM 36, data can be electrically erased and written. The EEPROM 36 is used as an area for storing data, such as ID information, for identifying individuals. A flash memory, high dielectric memory, or the like may be adopted in place of the EEPRPM 36.

An example of control logic for the system controller 41 is standby control logic. The standby state of the microcomputer 31 is instructed by the CPU 32 executing predetermined instructions, such as register operation instructions, to set a standby flag FLG. The releasing of standby state is instructed by clearing the standby flag FLG. The standby flag FLG is supplied to the CPG 39, CPU 32, and the like as well as a logic circuit LOG representatively shown with predetermined timing. The standby flag FLG is used to stop the clock generating operation of the CPG 39 and to control stoppage of instruction execution by the CPU 32.

The logic circuit LOG generates internal standby signals stb1 and stb2 in synchronization with the clock signal CK. The internal standby signals stb1 and stb2 are varied with the timing illustrated in FIG. 4. Similarly with the foregoing, the internal standby signals stb1 and stb2 are used to control the reduction of sub-threshold leakage currents in the memory array 11 of the mask ROM 40.

Figure 17:
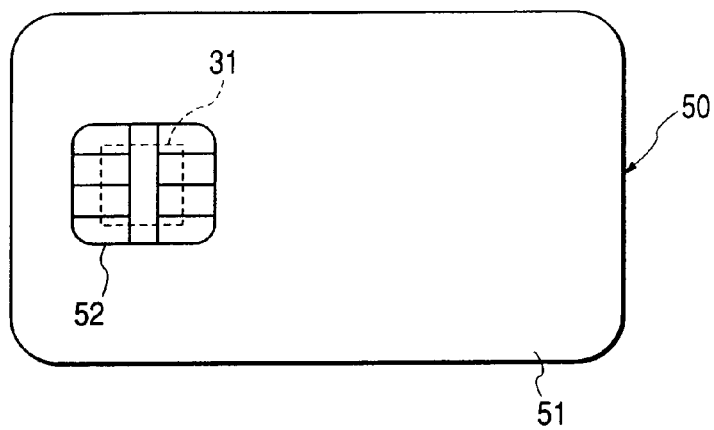
FIG. 17 is a plan view showing the appearance of a contact interface-type IC card using a microcomputer for IC card.

FIG. 17 shows the appearance of a contact interface-type IC card 50 using the microcomputer 31 for IC card. On the surface of a card substrate 51 made of synthetic resin, an interface terminal 52 comprising electrode patterns is exposed, and the microcomputer 31 illustrated in FIG. 16 is embedded therein. The electrode patterns of the interface terminal 52 are joined with the corresponding external terminals of the microcomputer 31.

Figure 18:
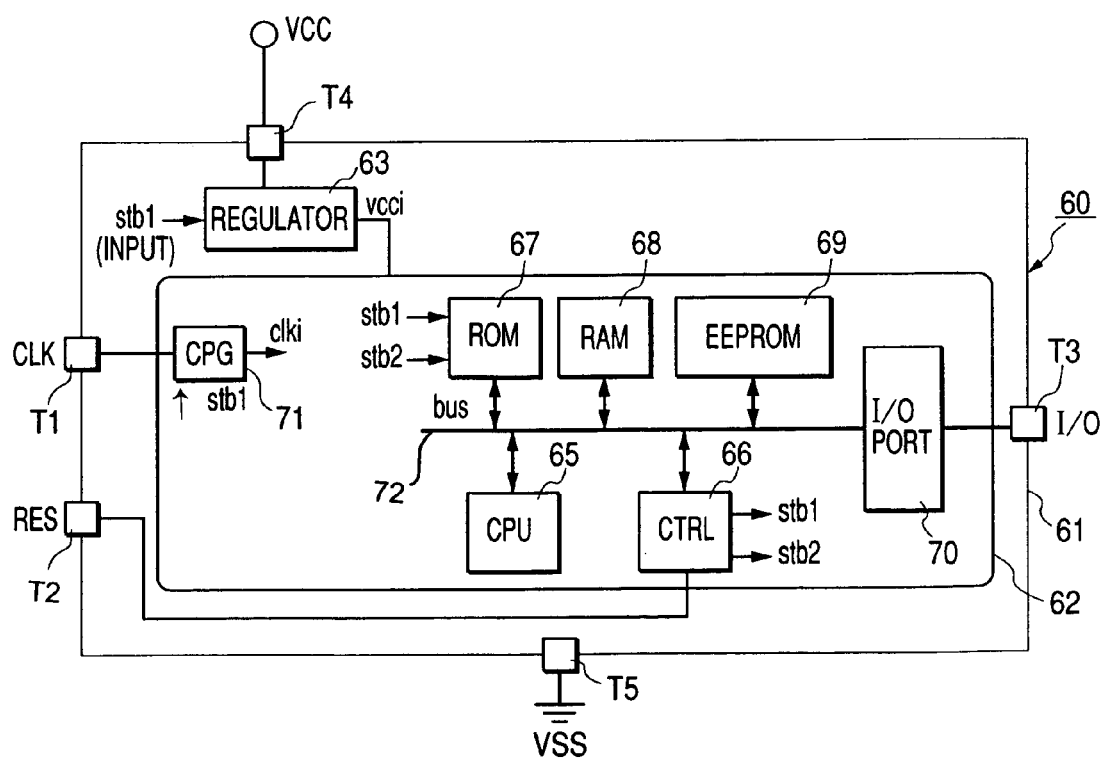
FIG. 18 is a block diagram illustrating another example of the IC card according to the present invention.

FIG. 18 illustrates another example of the IC card according to the present invention. The IC card 60 illustrated in the figure is a card device commonly referred to as "SIM (Subscriber Identity Module) card." The SIM card stores information related to the approval and administration of subscribers and accounting information in the GSM mobile communication system (GSM cellular phone). Further, the SIM card stores communication control programs for communication protocol. The SIM card is detachably loaded into a cellular phone, and is used in mobile communication.

The IC card 60 has in a card substrate 61 a microcomputer for IC card (also referred to as "IC card microcomputer") 62, a regulator 63, and external terminals T1 to T5 as external connection electrodes.

The IC card microcomputer 62 comprises CPU 65, a system controller (CTRL) 66, ROM 67, RAM 68, EEPROM 69, an I/O port 70, a clock pulse generator 71 comprising PLL (Phase Locked Loop), and an internal bus 72. The IC card microcomputer 62 has the same circuitry as in FIG. 16, and the detailed description of the individual components thereof will be omitted. The CPG 71 is supplied with clock CLK thrugh the external terminal T1 and outputs internal clock clki. The reset signal RES is inputted to the CTRL 66 through the external terminal T2. The I/O port 70 does serial input/output between it and the outside through the external terminal T3. Supply voltage VCC is applied to the external terminal T4, and the ground voltage of the circuit is applied to the external terminal T5. The regulator 63 generates internal voltage vcci from supply voltage VCC. The IC card microcomputer 61 uses internal voltage vcci as operating power supply.

The CTRL 66 outputs the above-mentioned standby signals stb1 and stb2. In standby state, the standby signals stb1 and stb2 are kept LOW. When transition takes place from standby state to active state, stb1 is brought to HIGH first, as mentioned above, and stb2 is brought to HIGH with delay. The control of the ROM 67 according to the standby signals stb1 and stb2 is the same as mentioned above. In standby state, the bit lines and the source lines are kept at the supply voltage level. In active state, the bit lines are brought to supply voltage, and the source lines are brought to the ground voltage of the circuit. When transitions takes place from standby state to active state, discharging of the source lines is controlled in two stages similarly with the foregoing. That is, the discharge rate is low at first and thereafter enhanced. In consideration of the influences of undesired resistive components and the like in charge and discharge paths for bit lines and source lines, the potential difference in the constitution in FIG. 3 and the like may be understood as follows: in active state, the potential difference between bit lines and source lines is maximized at the supply voltage level. In standby state, the potential difference between bit lines and source lines is minimized at zero. Further, the voltage generation circuit represented by that illustrated in FIG. 3 may be constituted from the perspective that the potential difference between bit lines and source lines in standby state is made smaller than that in active state. For example, the potential difference between bit lines and source lines in standby state may be reduced to half of supply voltage VCC. Reduction of power consumption in standby state can be also accomplished by this. Thus, in transition from standby state to active state, source line discharge operation is swiftly established.

The CPU 65 executes a sleep instruction in active state and transitions to standby state. To further reduce power consumption in standby state, the CPG 71 is fed with the standby signal stb1, and outputs the internal clock clki in active state and stops the output of the internal clock clki in standby state. The regulator 63 is fed with the standby signal stb1, and reduces the internal supply voltage in standby state to a value lower than that in active state.

Figure 19:
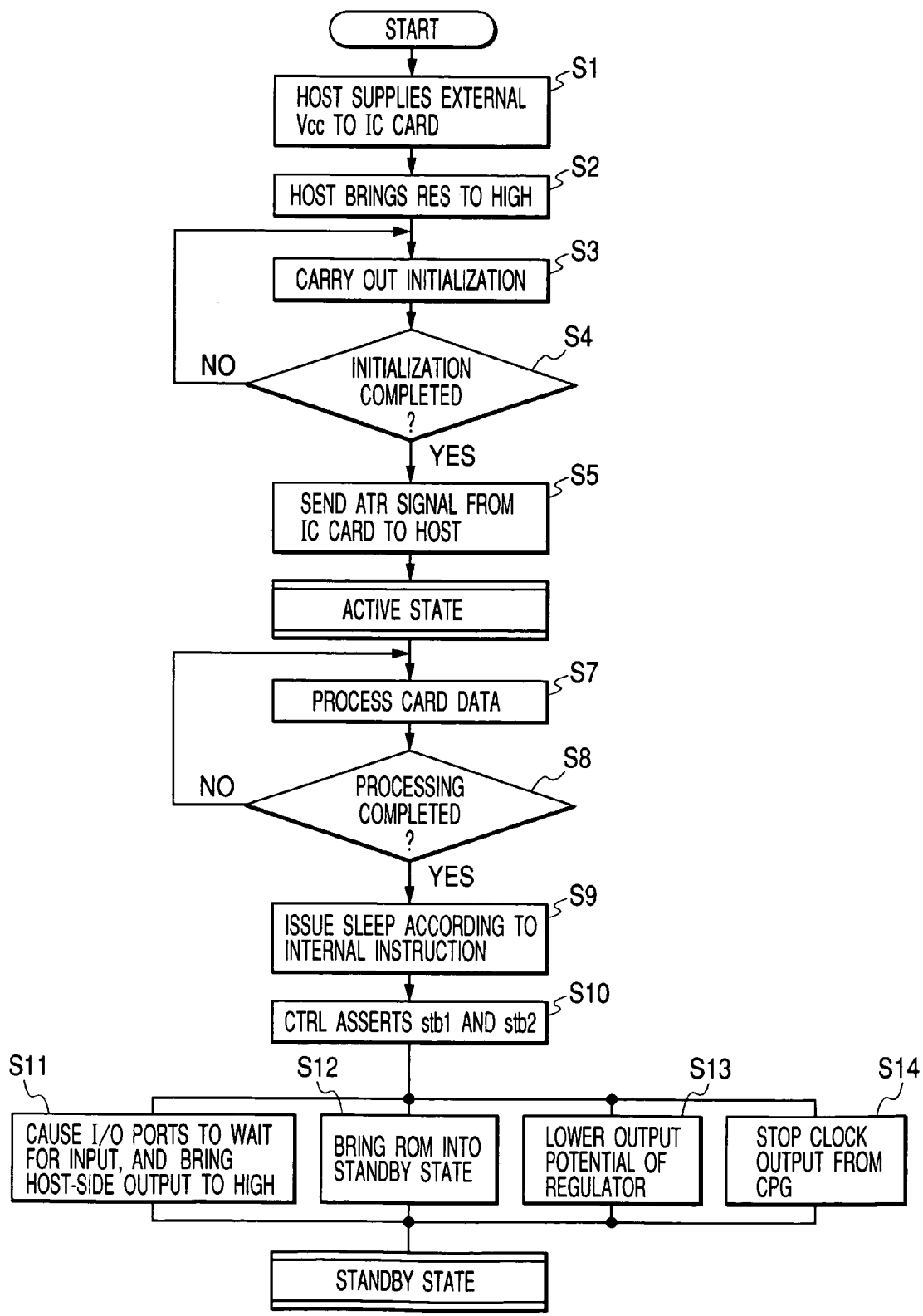
FIG. 19 is a flowchart illustrating the flow of operation from power application to an IC card to active state to standby state.

FIG. 19 illustrates the flow of operation from power application to the IC card to active state to standby state. The card host of the IC card 60 applies supply voltage VCC to the IC card 60 (S1) to change the level of the reset signal RES to HIGH (S2). As a result, the IC card microcomputer 61 carries out initialization (S3). After the completion of the initialization (S4), a reset acknowledgment signal (ATR) is sent from the I/O port back to the host (S5). Thus, the IC card microcomputer 62 transitions to active state. In active state, the CPU 65 processes card data in response to a request from the card host (S7). When the CPU 65 is not processing card data (S8), the CPU 65 executes a sleep instruction with predetermined timing (S9), and causes the CTRL 66 to assert the standby signals stb1 and stb2 (S10). Thus, the I/O port is fed with a HIGH-level signal outputted from the card host, and wait for transition to LOW (S11). The ROM 67 is brought into the above-mentioned standby state, and thus power consumption in the memory cells due to sub-threshold leakage is suppressed (S12). The level of the output potential vcci of the regulator 63 is reduced (S13).

The internal clock clki generating operation of the CPG 71 is stopped (S14). Thus, the IC card is brought into standby state.

Figure 20:
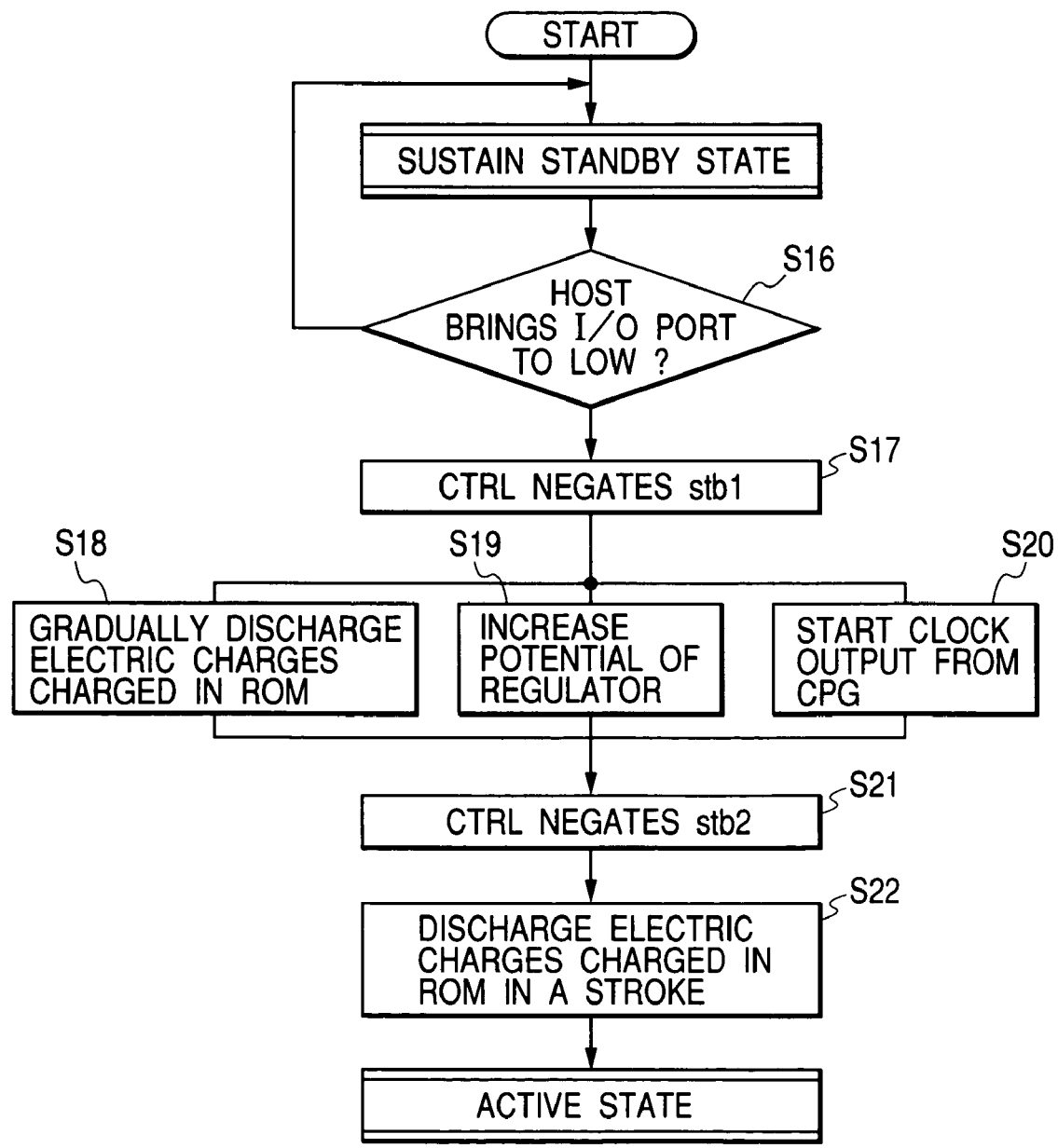
FIG. 20 is a flowchart illustrating the flow of operation wherein the IC card transitions from standby state to active state.

FIG. 20 illustrates the flow of operation wherein the IC card transitions from standby state to active state. Standby state is sustained until the I/O port 70 is brought to LOW (S16). When the I/O port 70 is brought to LOW, the CTRL 66 negates the standby signal stb1 first (S17). Thus, the ROM 67 gradually discharges the charged source lines (S18). The regulator 63 pulls the potential of internal voltage vcci up to the regular power supply potential (S19). The CPG 71 restarts the internal clock clki output operation (S20). Thereafter, the CTRL 66 negates the standby signal stb2 (S21), and the ROM 67 discharges charges in a stroke from the source lines which are in the process of discharging (S22). Thus, the IC card 60 is brought into active state. Thereafter, the processing of Step 7 and the following steps in FIG. 19 is carried out.

Figure 21:
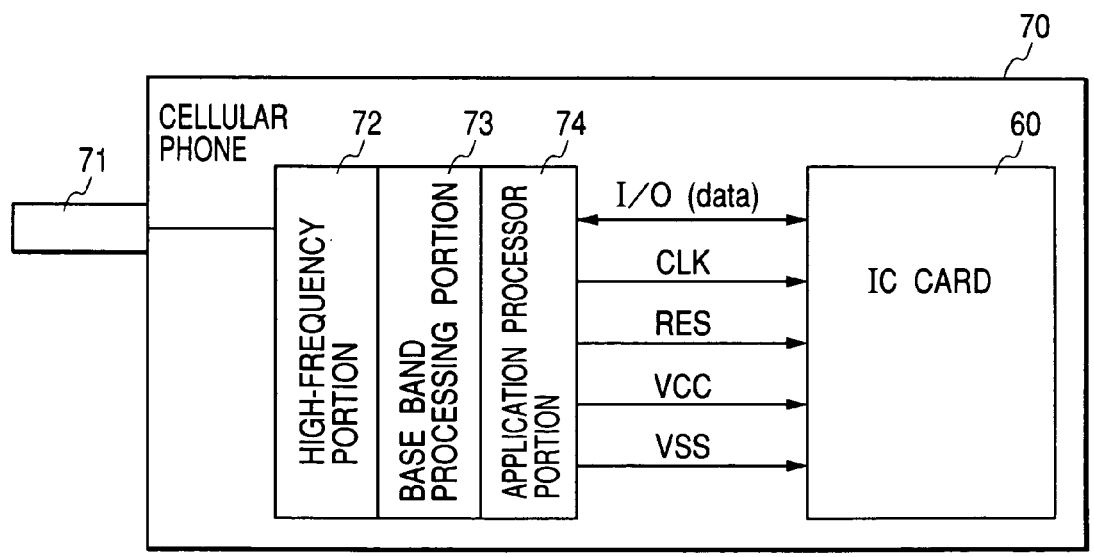
FIG. 21 is a block diagram illustrating a cellular phone to which the IC card is applied.

FIG. 21 illustrates a cellular phone to which the IC card 60 is applied. The cellular phone 70 comprises an antenna 71, a high-frequency portion 72, a base band processing portion 73, and an application processor portion 74. The IC card 60 is detachably loaded with the application processor 74 taken as the card host.

Figure 22:
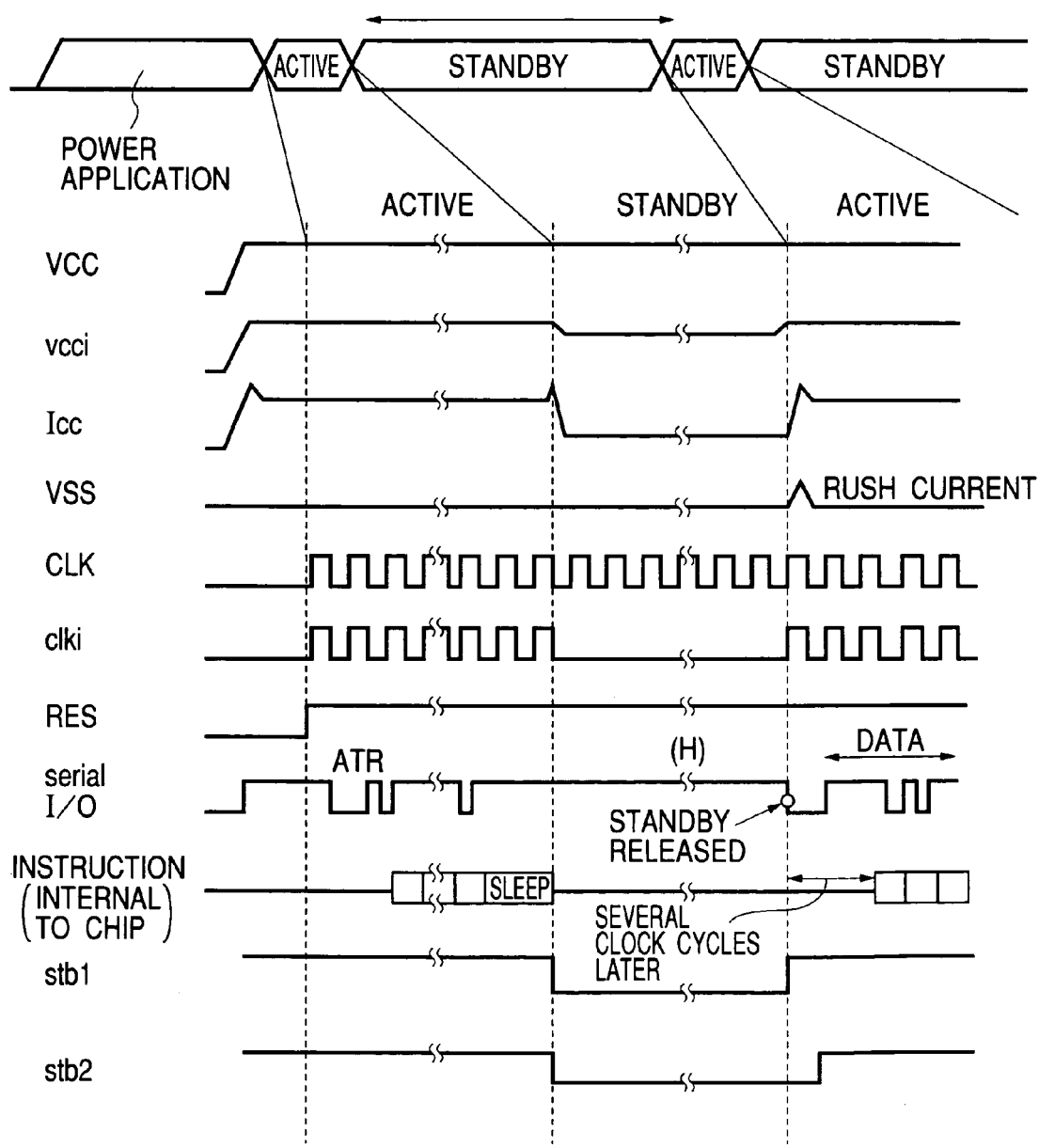
FIG. 22 is a timing chart illustrating the operation of the IC card loaded into a cellular phone.

FIG. 22 is a timing chart illustrating the operation of the IC card loaded into a cellular phone. During a telephone conversation and during standby processing in non-conversation conditions, the IC card is kept in active state. Standby processing in non-conversation conditions is carried out, for example, every 30 seconds. Icc is the output current of the regulator 63. The current Icc in standby state is reduced by suppressing sub-threshold leakage in the ROM 67 on standby (S12), lowering the output voltage vcci of the regulator (S13), and stopping the internal clock clki (S14). When transition takes place from standby state to active state, such control as to enhance stepwise the rate of discharging the source lines in the ROM is carried out (S18, S22). Therefore, the rush current of ground potential VSS (a current rushing into ground potential) is prevented from being markedly increased to make non-negligible ground noise.

Figure 23:
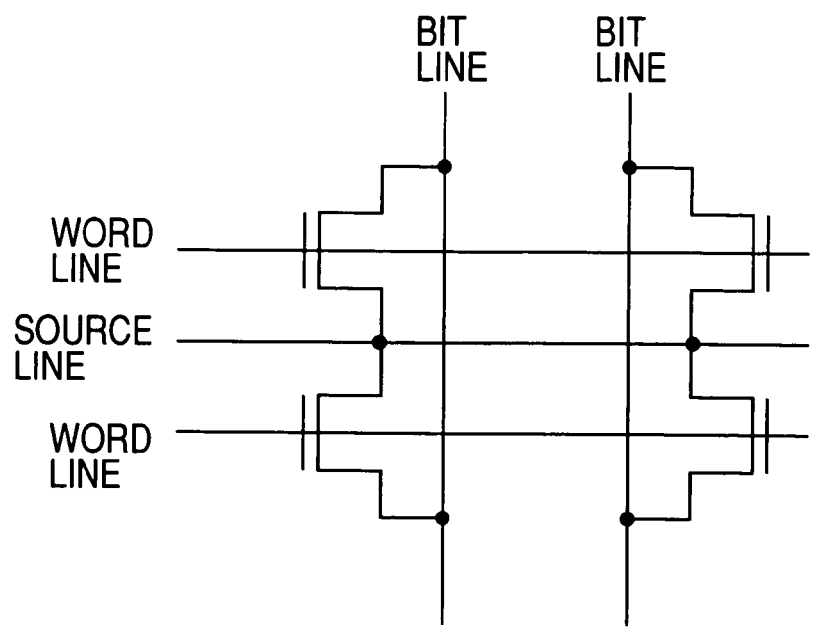
FIG. 23 is a schematic circuit diagram illustrating a part of another constitution of the memory array in a mask ROM to which the technology for suppressing sub-threshold leakage in memory cells on standby is applied.
Figure 24:
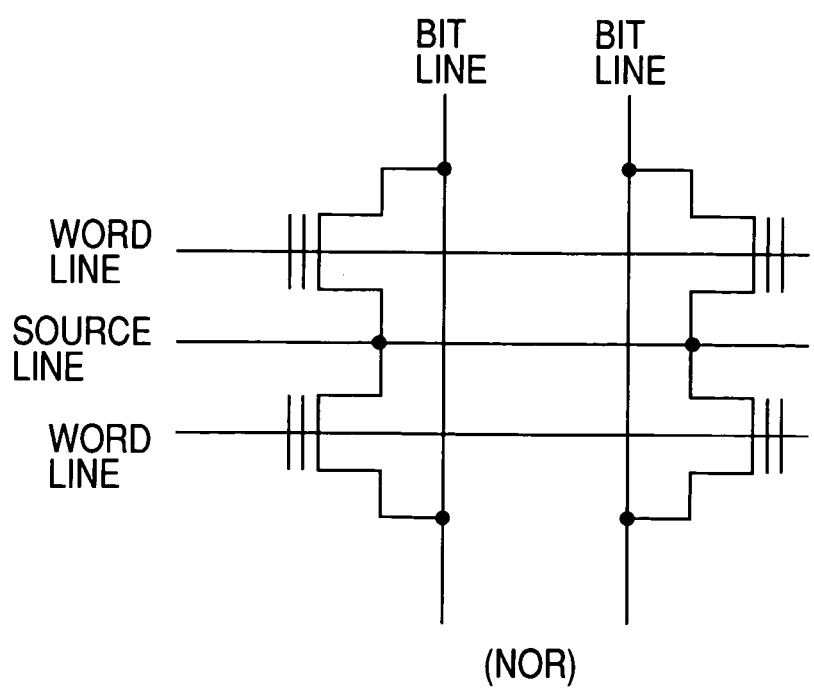
FIG. 24 is a schematic circuit diagram illustrating a part of the constitution of the NOR memory array in a flash memory to which the technology for suppressing sub-threshold leakage in memory cells on standby is applied.
Figure 25:
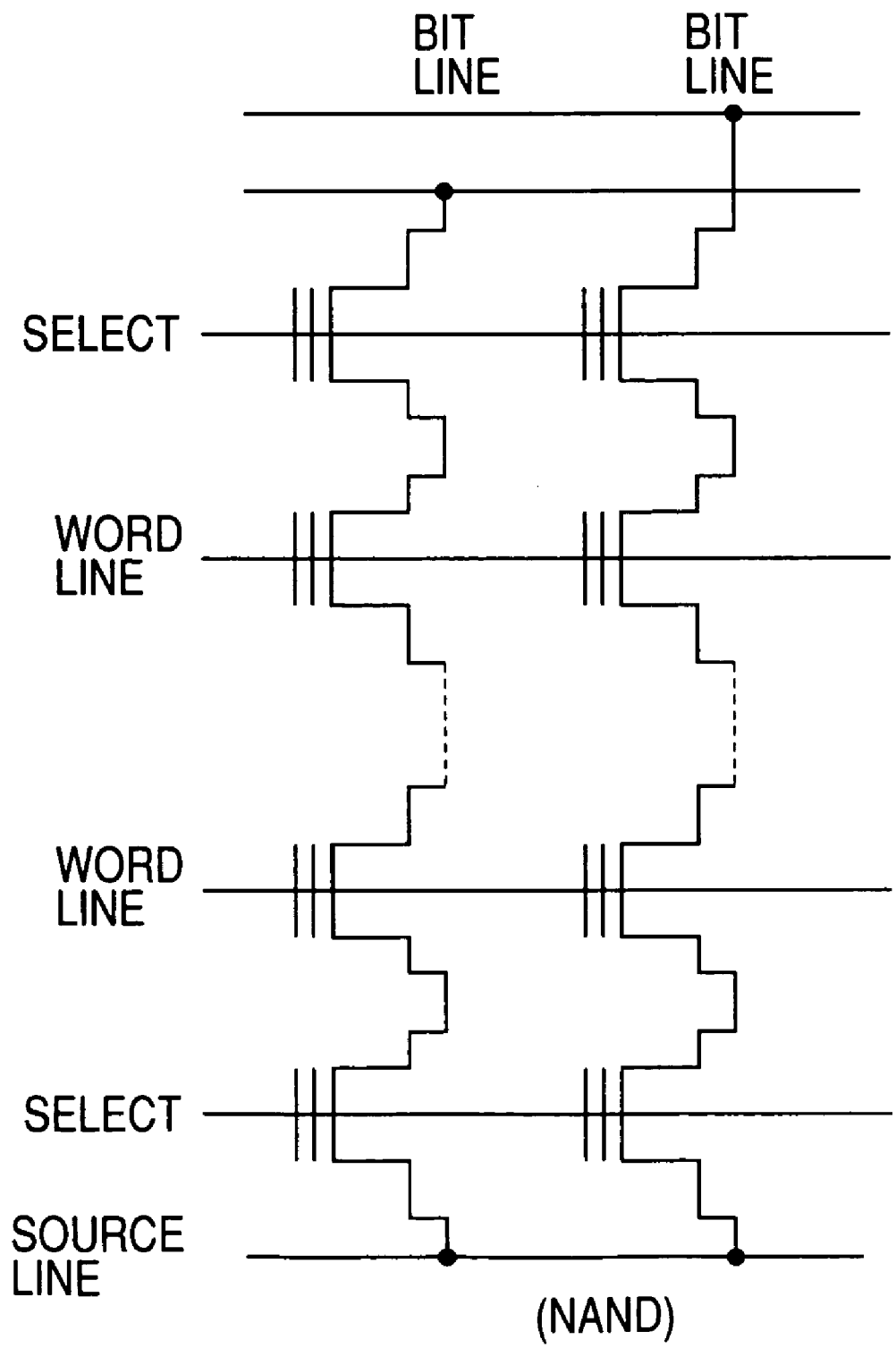
FIG. 25 is a schematic circuit diagram illustrating a part of the constitution of the NAND memory array in a flash memory to which the technology for suppressing sub-threshold leakage in memory cells on standby is applied.
Figure 26:
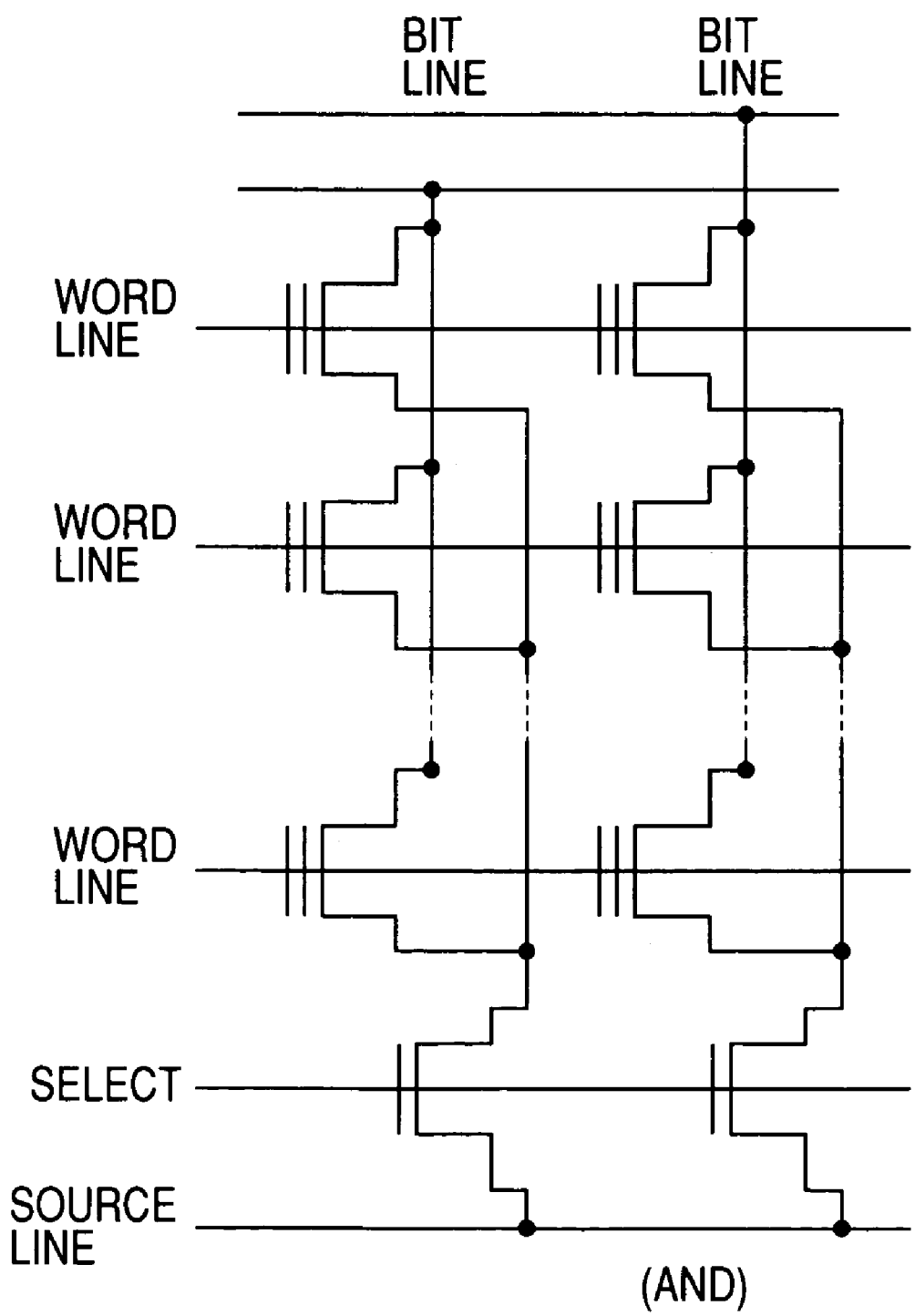
FIG. 26 is a schematic circuit diagram illustrating a part of the constitution of the AND memory array in a flash memory to which the technology for suppressing sub-threshold leakage in memory cells on standby is applied.

In the above description of the mask ROM 3, 40, and 67, the technology for suppressing sub-threshold leakage in memory cells on standby is applied to the memory cells of the memory. The source line described above may be shared between a pair of memory cells, as illustrated in FIG. 23. The memory to which the above technology for suppressing sub-threshold leakage is applied is not limited to mask ROM, and an electrically programmable memory, such as flash memory, may be used instead. In case of flash memory, the memory array thereof can be configured in various manners. Possible configurations include NOR-type memory array configuration illustrated in FIG. 24 wherein a source line is shared between each pair of nonvolatile memory cells which share a bit line; NAND-type memory cell array configuration illustrated in FIG. 25; and AND-type memory cell array configuration illustrated in FIG. 26. In case of flash memory, for example, memory cells in write state is of enhancement type, and memory cells in erase state in which data is not written is of depletion type. In the readout operation in a NAND-type memory cell array, the word lines of memory cells from which data is read out are kept at the unselect level, such as 0V, and the other word lines are kept at the select level, such as supply voltage.

Figure 27:
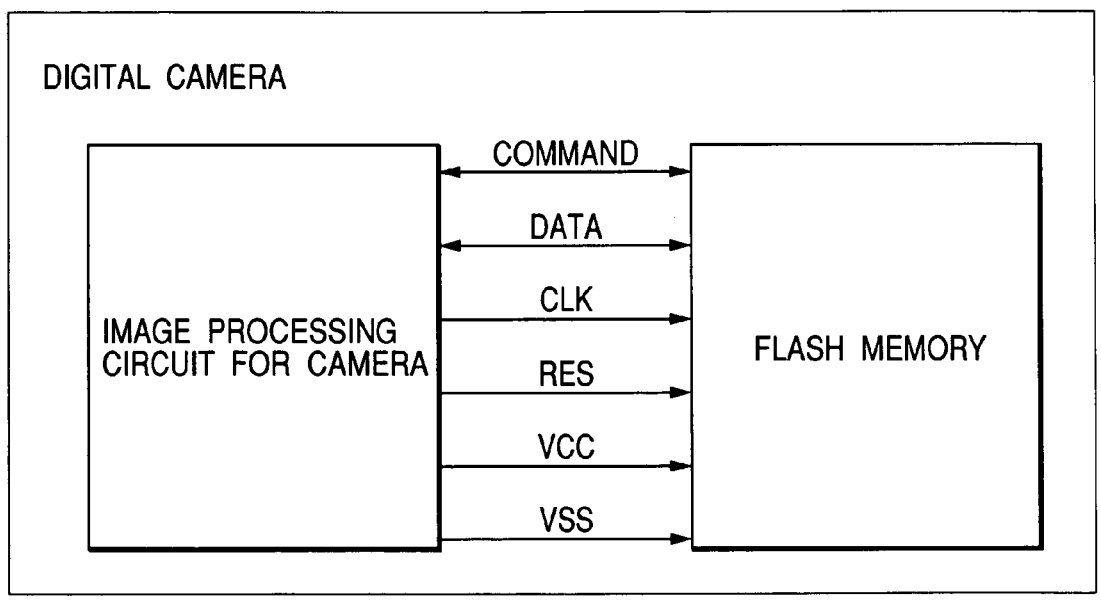
FIG. 27 is a block diagram illustrating a digital camera which adopts as a storage device a flash memory to which the technology for suppressing sub-threshold leakage in memory cells on standby is applied.

A flash memory to which the technology for suppressing sub-threshold leakage in memory cells on standby is applied has a variety of applications. As a card device, such as a flash memory card, or as a flash memory chip directly connected to a circuit board, the flash memory can be applied to, for example, a storage for digital camera, illustrated in FIG. 27.

Up to this point, the invention made by the inventors concerned have been described based on embodiments thereof. The present invention is not limited to these embodiments, and, needless to add, it can be modified in various manners to the extent that the subject matter thereof is not departed from.

For example, standby state may be instructed by the CPU executing a predetermined instruction, such as a sleep instruction, when external signals, such as a standby signal, is in specific state. The concrete constitution of the precharge circuit or the charge and discharge circuit is not limited to the foregoing, and it may be modified as appropriate. The charge level need not be equal to external supply voltage. In a semiconductor integrated circuit wherein external supply voltage is reduced to obtain operating power supply or a semiconductor integrated circuit wherein a plurality of divided voltages are used for internal operating power supply, such reduced voltage or divided voltage may be taken as charge level. The memory as the object of sub-threshold leakage current suppression according to the present invention is not limited to mask ROM. The present invention is applicable to an electrically programmable memory, such as flash memory and EEPROM, and further to memories of other storage methods.

In the above description, the invention made by the inventors is applied to mainly microcomputer and IC card microcomputer. These are in the field of utilization that is the background against which the present invention has been made. However, the applications of the present invention are not limited thereto. It is applicable to a wide variety of semiconductor integrated circuits, including communication control LSI and application specific system LSI.

What is claimed is:

1. A semiconductor integrated circuit, comprising:
   a central processing unit;
   a memory including instructions and data;
   a clock generator for generating a plurality of clock signals; and
   a bus coupled to said central processing unit and said memory,
   wherein said semiconductor integrated circuit has a plurality of operation states including an active state and a standby state,
   wherein said semiconductor integrated circuit is instructed as to a transition of the operation state from said active state to said standby state, when said central processing unit executes a predetermined instruction,
   wherein said central processing unit can access said memory and said clock generator provides a clock signal to said central processing unit, in said active state,
   wherein said central processing unit stops an operation and said clock generator stops generating said clock signals, in said standby state,
   wherein said memory has voltage generation circuits for bit lines and source lines with which memory cells are connected, and
   wherein said voltage generation circuits make the potential of said bit lines and the potential of said source lines equal to each other in response to an instruction to transition from said active state to said standby state, and produce a potential difference between said bit lines and said source lines in response to an instruction to transition from said standby state to said active state.

2. The semiconductor integrated circuit according to claim 1,
wherein said voltage generation circuits make the potential of said source lines equal to the precharge potential of said bit lines in response to an instruction to transition from said active state to said standby state.

3. The semiconductor integrated circuit according to claim 1,
wherein said voltage generation circuits make the potential of said bit lines equal to the discharge potential of said source lines in response to an instruction to transition from said active state to said standby state.

4. The semiconductor integrated circuit according to claim 2,
wherein said voltage generation circuits discharge the source lines in response to an instruction to transition from said standby state to said active state, and the current supplying capability thereof is varied so that the discharge rate will be enhanced stepwise.

5. A semiconductor integrated circuit, comprising:
a central processing unit provided a clock signal from a clock generator;
a memory accessible from said central processing unit, and said memory can enter an active state or a standby state; and
a bus coupled to said central processing unit and said memory,
wherein said semiconductor integrated circuit has a plurality of operation states including said active state and said standby state,
wherein said semiconductor integrated circuit is instructed as to a transition of the operation state from said active state to said standby state, when said central processing unit executes a predetermined instruction,
wherein said central processing unit can access said memory and said clock generator provides said clock signal to said central processing unit, in said active state,
wherein said central processing unit stops an operation and said clock generator stops providing said clock signal to said central processing unit, in said standby state, and
wherein said memory includes memory cells connected with bit lines and source lines, and makes the potential of said bit lines and the potential of said source lines equal to each other in said standby state and can produce a potential difference between said bit lines and said source lines in said active state.

6. The semiconductor integrated circuit according to claim 5,
wherein in said standby state, said central processing unit stops instruction execution, and the memory stops access operation.

7. The semiconductor integrated circuit according to claim 6,
wherein instructions to transition from said active state to said standby state and instructions to transition from said standby state to said active state are given by an external control signal.

8. The semiconductor integrated circuit according to claim 6,
wherein instructions to transition from said active state to said standby state are given by the central processing unit executing a predetermined instruction, and instructions to transition from said standby state to said active state are given by an interrupt.

9. A semiconductor integrated circuit, comprising:
a memory including instructions and data;
a central processing unit which can access said memory;
a clock generator for generating a plurality of clock signals; and
a bus coupled to said central processing unit and said memory,
wherein said semiconductor integrated circuit has a plurality of operation modes including an active mode and a standby mode,
wherein said semiconductor integrated circuit is instructed as to a transition of the operation mode from said active mode to said standby mode, when said central processing unit executes a predetermined instruction,
wherein said central processing unit can access said memory and said clock generator provides a clock signal to said central processing unit, in said active mode,
wherein said central processing unit stops an operation and said clock generator stops generating said clock signals, in said standby mode, and
wherein said memory has memory cells connected with bit lines and source lines, and makes the potential of said source lines equal to the precharge potential of said bit lines in said standby mode and brings the source lines to discharge potential in said active mode.

10. A semiconductor integrated circuit, comprising:
a memory including instructions and data;
a central processing unit which can access said memory;
a clock generator for generating a plurality of clock signals and controlled by said central processing unit; and
an internal bus coupled to said central processing unit and said memory,
wherein said semiconductor integrated circuit has a plurality of operation modes including an active mode and a standby mode,
wherein said active mode is changed to said standby mode, when said central processing unit executes a predetermined instruction,
wherein said central processing unit can access said memory and said clock generator provides a clock signal to said central processing unit, in said active mode,
wherein said central processing unit stops an operation and said clock generator stops generating said clock signals, in said standby mode, and
wherein said memory has memory cells connected with bit lines and source lines, and makes the potential of said bit lines equal to the discharge potential of said source lines in said standby state and brings the bit lines to precharge potential in said active state.

11. The semiconductor integrated circuit according to claim 9,
wherein the central processing unit is brought into a state in which instruction execution is stopped in parallel with said memory entering said standby mode, and said standby mode and said state in which instruction execution is stopped can be released by an interrupt or external control signal.

12. A semiconductor integrated circuit, comprising:
a central processing unit;
a memory accessible from said central processing unit; and
a bus coupled to said central processing unit and said memory, wherein said semiconductor integrated circuit has a plurality of operation states including a first state and a second state, wherein said semiconductor integrated circuit changes said first state to said second state, when said central processing unit executes a predetermined instruction, wherein said memory has bit lines connected with a first circuit, source lines connected with a second circuit, and memory cells which are connected with said bit lines and said source lines and whose select terminals are connected with word lines, wherein said semiconductor integrated circuit can select said first state in which the access operation of said memory and the data processing operation of the central processing unit are enabled, and said second state in which the access operation of said memory and the data processing operation of the central processing unit are disabled, and wherein in said first state, said first circuit charges the bit lines and said second circuit discharges the source lines, and in said second state, said first circuit charges the bit lines and said second circuit charges the source lines.

13. A semiconductor integrated circuit, comprising:

a central processing unit;

a memory accessible from said central processing unit; and a clock generator for generating a plurality of clock signals, wherein said semiconductor integrated circuit has a plurality of operation states including a first state and a second state, wherein said semiconductor integrated circuit changes said first state to said second state, when said central processing unit executes a predetermined instruction in said first state, wherein said clock generator provides a clock signal to said central processing unit in said first state, and said clock generator stops providing the clock signal in said second state, wherein said memory has bit lines connected with a first circuit, source lines connected with a second circuit, and memory cells which are connected with said bit lines and said source lines and whose select terminals are connected with word lines, wherein said semiconductor integrated circuit can select said first state in which the access operation of said memory and the data processing operation of the central processing unit are enabled, and said second state in which the access operation of said memory and the data processing operation of the central processing unit are disabled, and wherein in said first state, said first circuit charges the bit lines and said second circuit discharges the source lines, and in said second state, said first circuit discharges the bit lines and said second circuit discharges the source lines.

14. The semiconductor integrated circuit according to claim 13, wherein the ultimate level of the discharge is equal to the ground potential of the circuit and the unselect level of said word lines is equal to the ground potential of the circuit.

15. The semiconductor integrated circuit according to claim 13, wherein in said first state, said first circuit stops the operation of charging the bit lines through which readout is carried out.

16. A semiconductor integrated circuit, comprising:

a central processing unit;

a clock generator for generating a plurality of clock signals; and a memory including memory cells connected with bit lines and source lines and voltage generation circuits for the bit lines and the source lines, wherein said semiconductor integrated circuit has a plurality of operation states including an active state and a standby state, wherein said semiconductor integrated circuit changes said active state to said standby state, when said central processing unit executes a predetermined instruction in said active state, wherein said clock generator provides a clock signal to said central processing unit in said active state, and said clock generator stops providing the clock signal in said standby state, and wherein in said active state, said voltage generation circuits produce a predetermined potential difference between said bit lines and said source lines, and in said standby state, said voltage generation circuits reduce the potential difference between said bit lines and said source lines of said memory to a value smaller than the potential difference in said active state.

17. The semiconductor integrated circuit according to claim 16, wherein in the process of the semiconductor integrated circuit transitioning from said standby state to said active state, said voltage generation circuits produce said predetermined potential difference between said bit lines and said source lines by source line discharge, and enhance the discharge rate stepwise.

* * * * *